US012805333B2

(12) United States Patent
Kim et al.

(10) Patent No.: US 12,805,333 B2

(45) Date of Patent: Nov. 17, 2026

(54) SEMICONDUCTOR DEVICE AND METHOD OF FORMING C2W PACKAGE WITH EMI SHIELDING

(71) Applicant: STATS ChipPAC Pte. Ltd., Singapore (SG)

(72) Inventors: ChangOh Kim, Incheon (KR); YoungCheol Kim, Gyeonggi-do (KR); JinHee Jung, Incheon (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 335 days.

(21) Appl. No.: 18/651,785

(22) Filed: May 1, 2024

(65) Prior Publication Data

US 2025/0343158 A1 Nov. 6, 2025

(51) Int. Cl.

| | |
|---|---|
| ***H10W 42/20*** | (2026.01) |
| ***H10W 70/05*** | (2026.01) |
| ***H10W 70/60*** | (2026.01) |
| ***H10W 74/01*** | (2026.01) |
| ***H10W 74/10*** | (2026.01) |
| ***H10W 90/00*** | (2026.01) |

(52) U.S. Cl.

CPC ......... *H10W 42/20* (2026.01); *H10W 70/095* (2026.01); *H10W 70/611* (2026.01); *H10W 74/01* (2026.01); *H10W 74/114* (2026.01); *H10W 90/401* (2026.01)

(58) Field of Classification Search

CPC . H10W 42/20; H10W 70/095; H10W 70/611; H10W 74/01; H10W 74/114; H10W 90/401; H10W 74/014; H10W 74/117; H10W 90/701; H10W 20/20; H10W 42/60; H10W 44/20; H10W 72/0198; H10W 74/121; H10W 90/00

USPC .......................................................... 257/659

See application file for complete search history.

(56) References Cited

U.S. PATENT DOCUMENTS

| | | | | |
|---|---|---|---|---|
| 10,074,614 | B2 | 9/2018 | Gong et al. | |
| 10,163,867 | B2 | 12/2018 | Kim et al. | |
| 11,581,287 | B2 | 2/2023 | Sankman et al. | |
| 2019/0252325 | A1 | 8/2019 | Chen et al. | |
| 2021/0407927 | A1* | 12/2021 | Salmon ................ | H10W 40/22 |

* cited by examiner

*Primary Examiner* — Wael M Fahmy

(74) *Attorney, Agent, or Firm* — Brian M. Kaufman; Robert D. Atkins; PATENT LAW GROUP: Atkins and Associates, P.C.

(57) ABSTRACT

A semiconductor device has a substrate and an electrical component disposed over the substrate. A conductive post is formed over the substrate. An interposer can be disposed over the substrate and the electrical component disposed over the interposer and the conductive post formed over the interposer. An encapsulant is deposited over and around the substrate, electrical component, and conductive post. A shielding material is disposed over the substrate and encapsulant and grounded through the conductive post. The shielding material can be grounded through the interposer. A wire can be embedded in the encapsulant and coupled to the shielding material to ground the shielding material. A conductive via can be formed through the substrate and coupled to the shielding material to ground the shielding material. An interposer can be disposed over the encapsulant. A second shielding material can be disposed over the encapsulant and first shielding material.

23 Claims, 25 Drawing Sheets

124
122
126
120

136
124
122
126
132
134
130
120

140b
140a
116
114
104

SEMICONDUCTOR DEVICE AND METHOD OF FORMING C2W PACKAGE WITH EMI SHIELDING

FIELD OF THE INVENTION

The present invention relates in general to semiconductor devices and, more particularly, to a semiconductor device and method of forming a chip-to-wafer (C2W) package with EMI shielding.

BACKGROUND OF THE INVENTION

Semiconductor devices are commonly found in modern electronic products. Semiconductor devices perform a wide range of functions, such as signal processing, high-speed calculations, transmitting and receiving electromagnetic signals, controlling electronic devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices, particularly in high frequency applications, such as radio frequency (RF) wireless communications, often contain one or more integrated passive devices (IPDs) to perform necessary electrical functions. Multiple semiconductor die and IPDs can be integrated into an SiP module for higher density in a small space and extended electrical functionality. Within the SIP module, semiconductor die and IPDs are disposed on a substrate for structural support and electrical interconnect. An encapsulant is deposited over the semiconductor die, IPDs, and substrate.

The SIP module includes high speed digital and RF electrical components, highly integrated for small size and low height, and operating at high clock frequencies and high power rating. An electromagnetic shielding material is commonly conformally applied over the encapsulant. The electromagnetic shielding material reduces or inhibits electromagnetic interference (EMI), radio frequency interference (RFI), and other inter-device interference, for example as radiated by high-speed digital devices, from affecting neighboring devices within or adjacent to SiP module.

Semiconductor die and IPDs can be mounted to a substrate in a C2W type assembly. The C2W assembly may require shielding to reduce or inhibit EMI, RFI, and other inter-device interference.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are disposed on a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
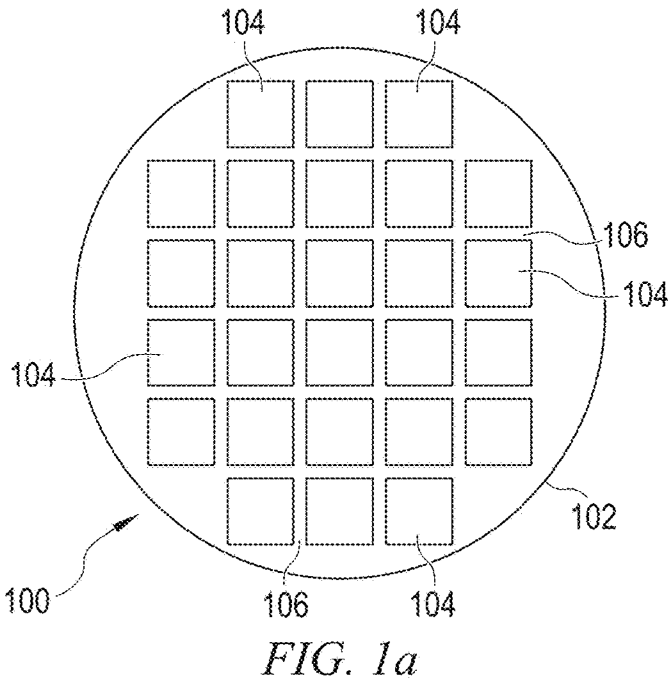
FIGS. 1*a*-1*c* illustrate a semiconductor wafer with a plurality of semiconductor die separated by a saw street.

FIG. 1*a* shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
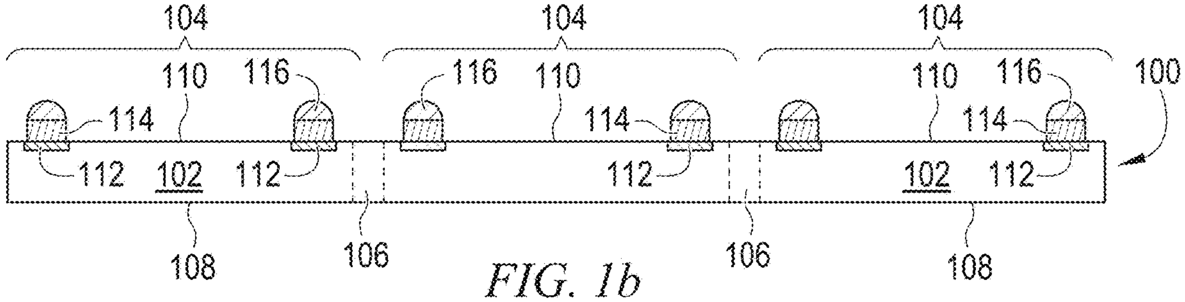

FIG. 1*b* shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive post 114 is formed over conductive layer 112 using PVD, CVD, electrolytic plating, electroless plating process, or other suitable metal deposition process. Conductive post 114 can be one or more layers of Al, Cu, Sn, Ni, Au, Ag, or other suitable electrically conductive material.

An electrically conductive bump material is deposited over conductive post 114 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive post 114 using a suitable attachment or bonding process. In one embodiment, the bump material is reflowed by heating the material above its melting point to form balls or bumps 116. In one embodiment, bump 116 is formed over an under bump metallization (UBM) having a wetting layer, barrier layer, and adhesive layer. Bump 116 can also be compression bonded or thermocompression bonded to conductive post 114. Bump 116 represents one type of interconnect structure that can be formed over conductive post 114. The interconnect structure can also use bond wires, conductive paste, stud bump, micro bump, or other electrical interconnect.

Figure 1C:
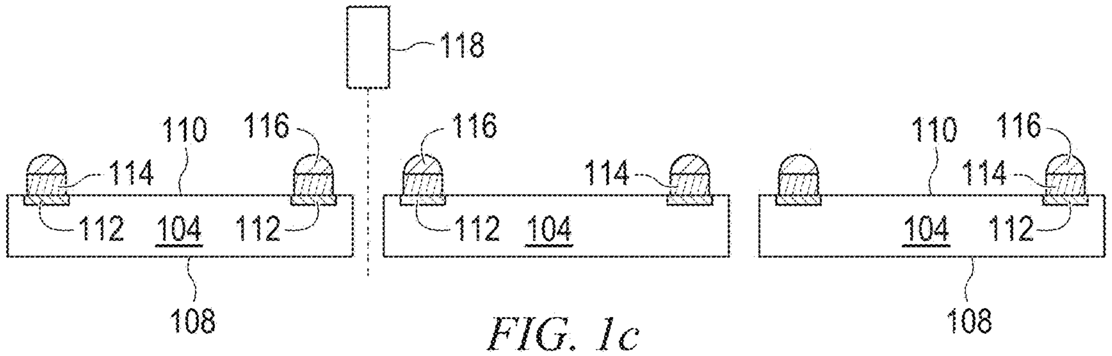

In FIG. 1*c*, semiconductor wafer 100 is singulated through saw street 106 using a saw blade or laser cutting tool 118 into individual semiconductor die 104. The individual semiconductor die 104 can be inspected and electrically tested for identification of known good die or unit (KGD/KGU) post singulation.

Figures 2A, 2B, 2C:
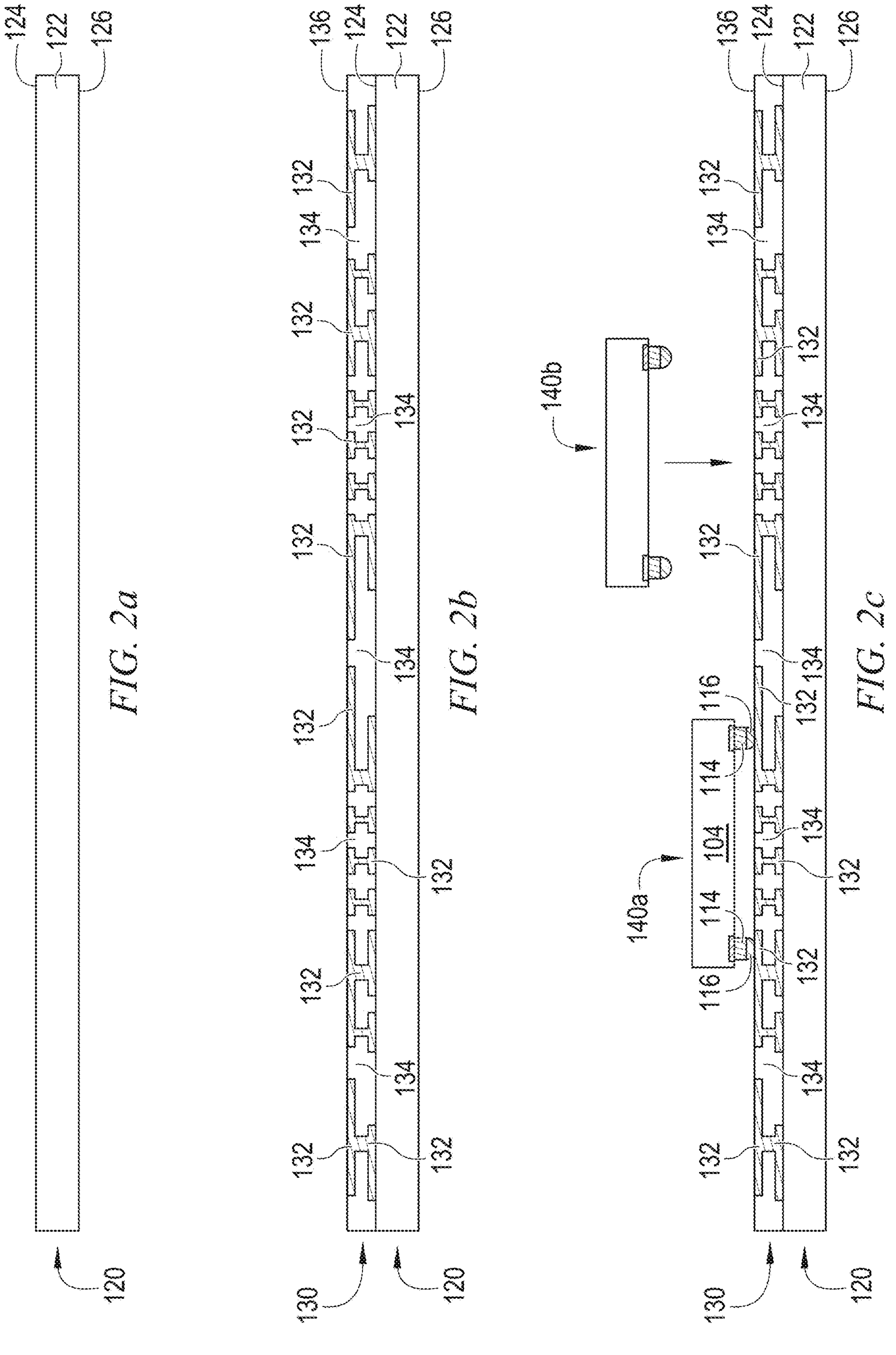
FIGS. 2*a*-2*s* illustrate a process of forming a C2W package with shielding grounded through conductive posts and conductive pins.
Figure 2D:
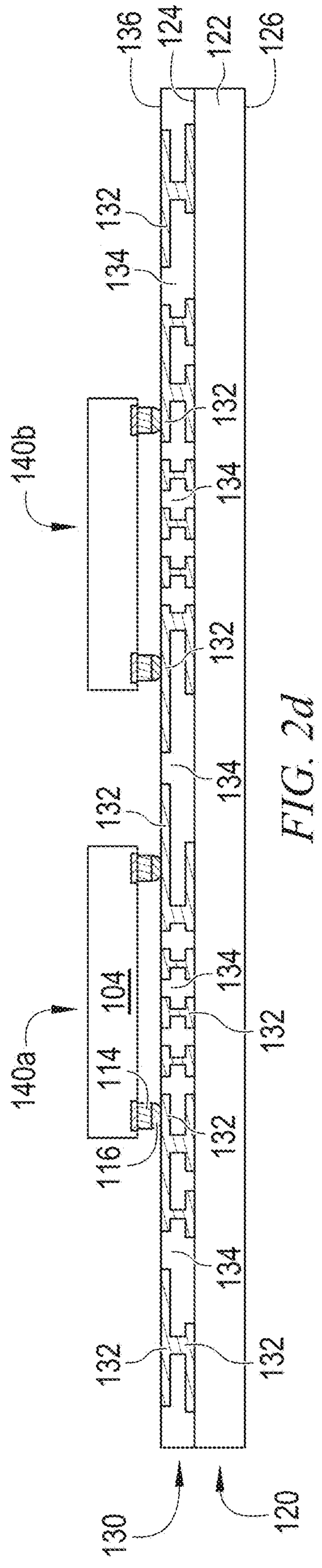
Figure 2E:
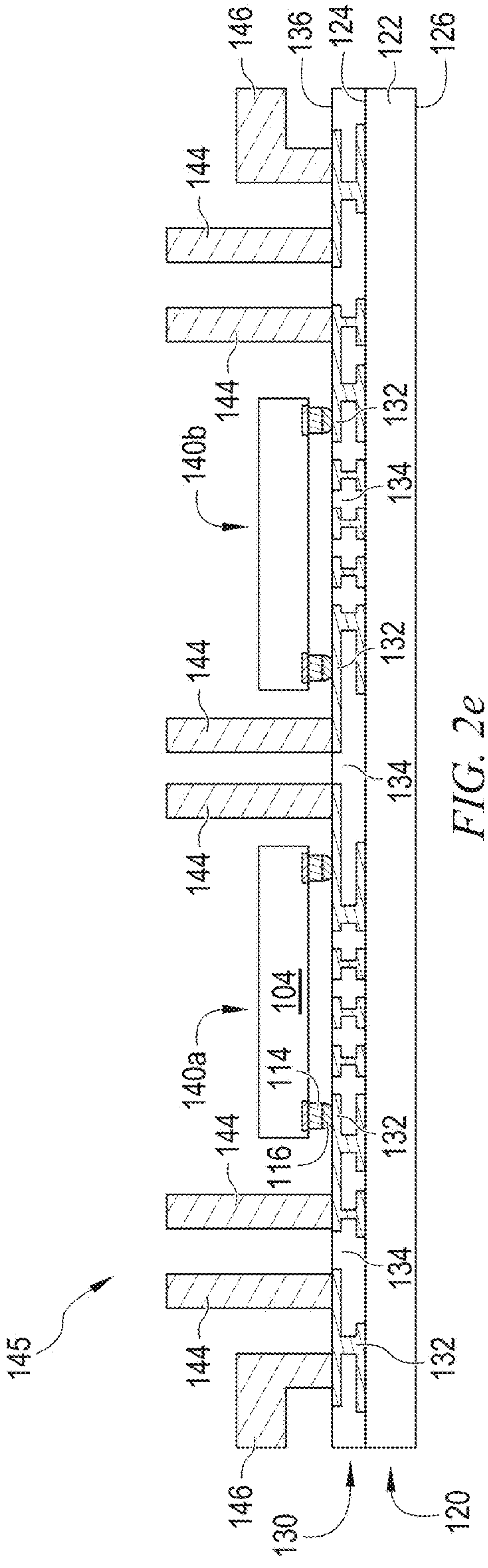
Figure 2F:
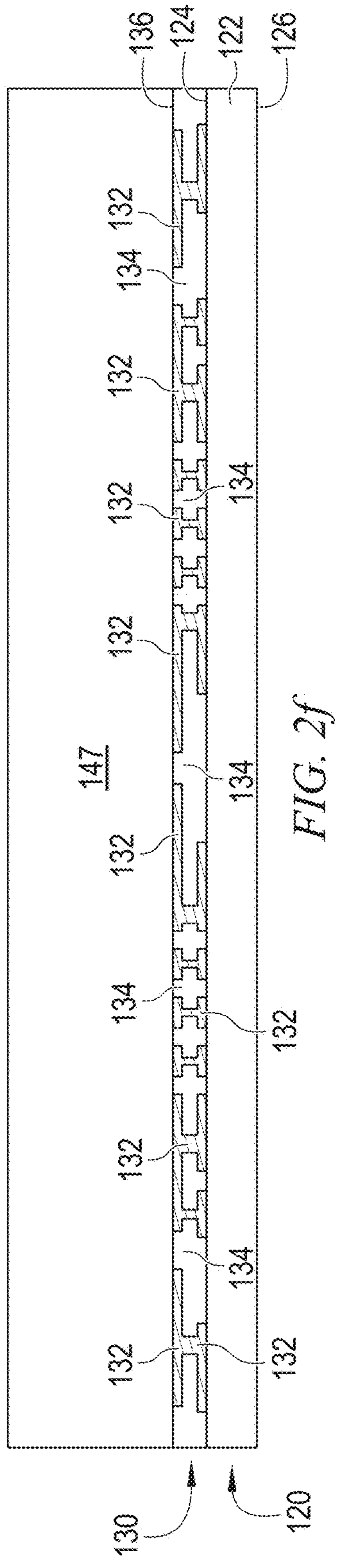
Figure 2G:
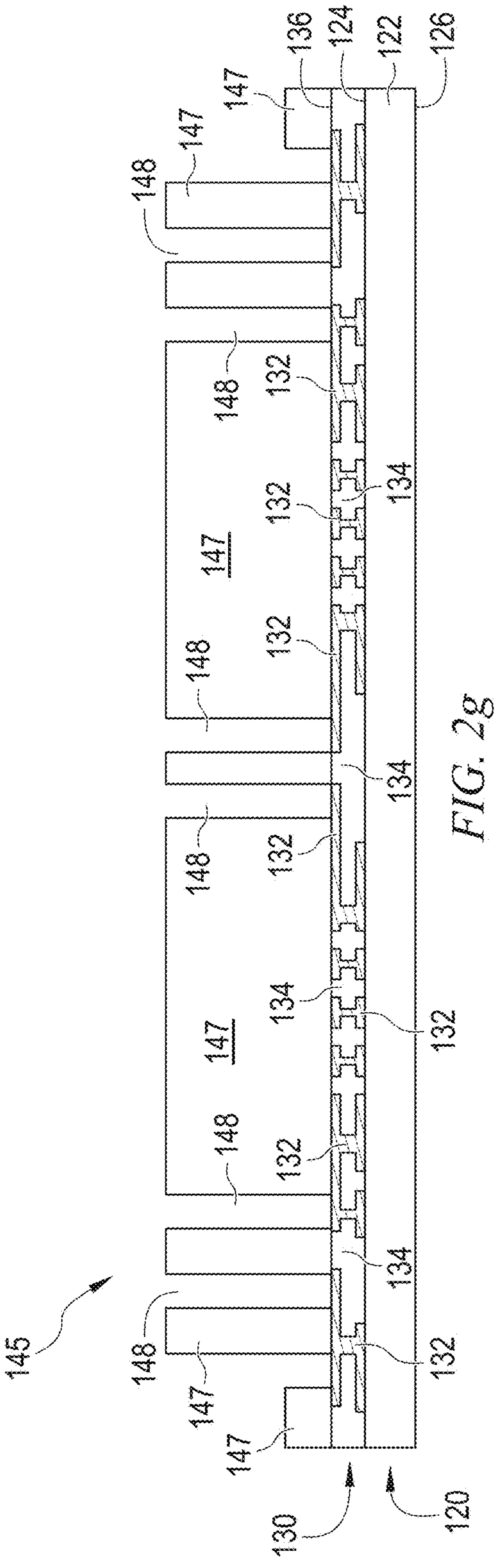
Figure 2H:
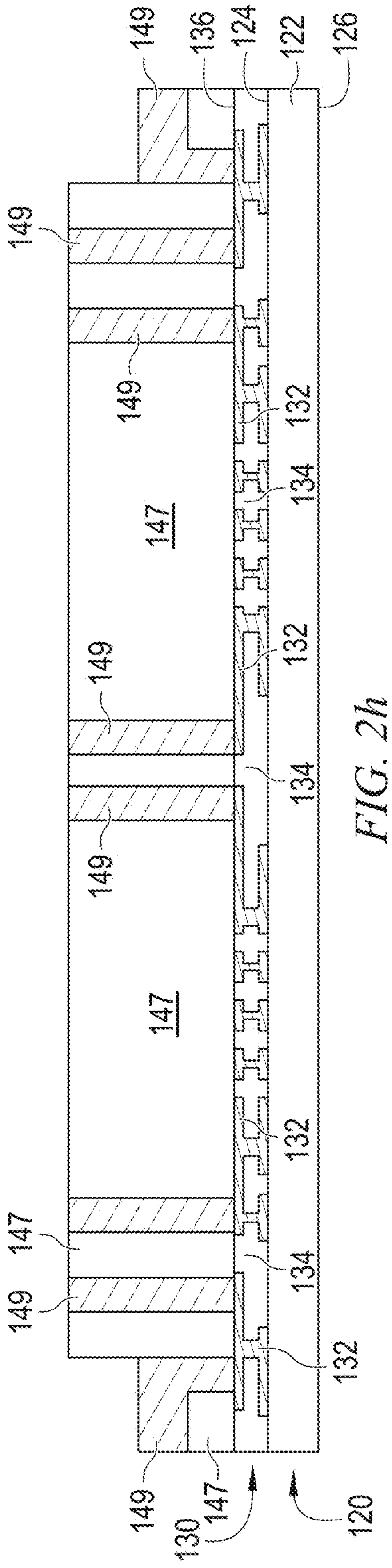
Figure 2I:
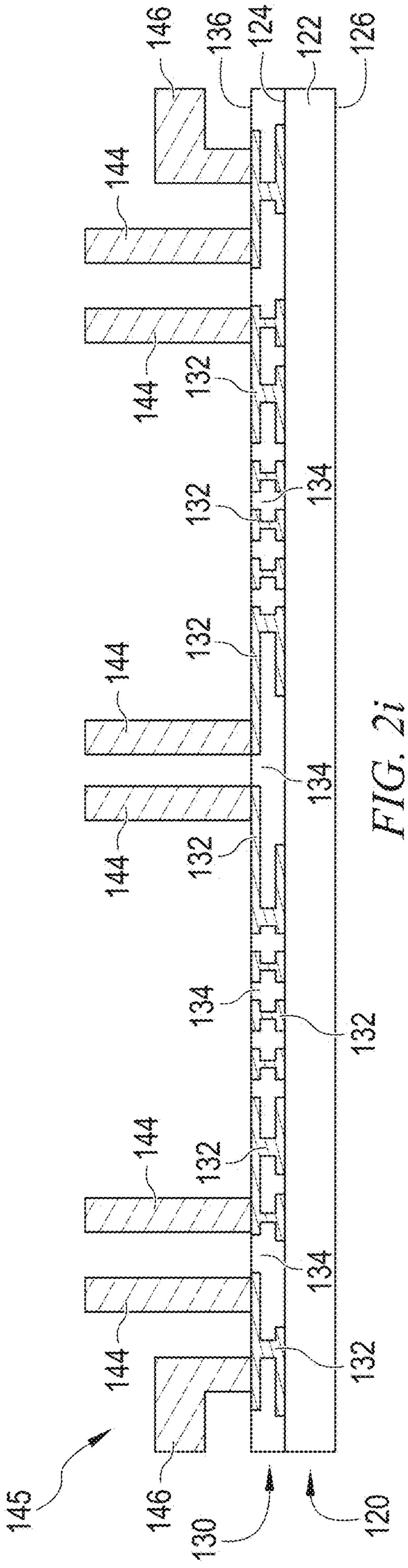
Figure 2J:
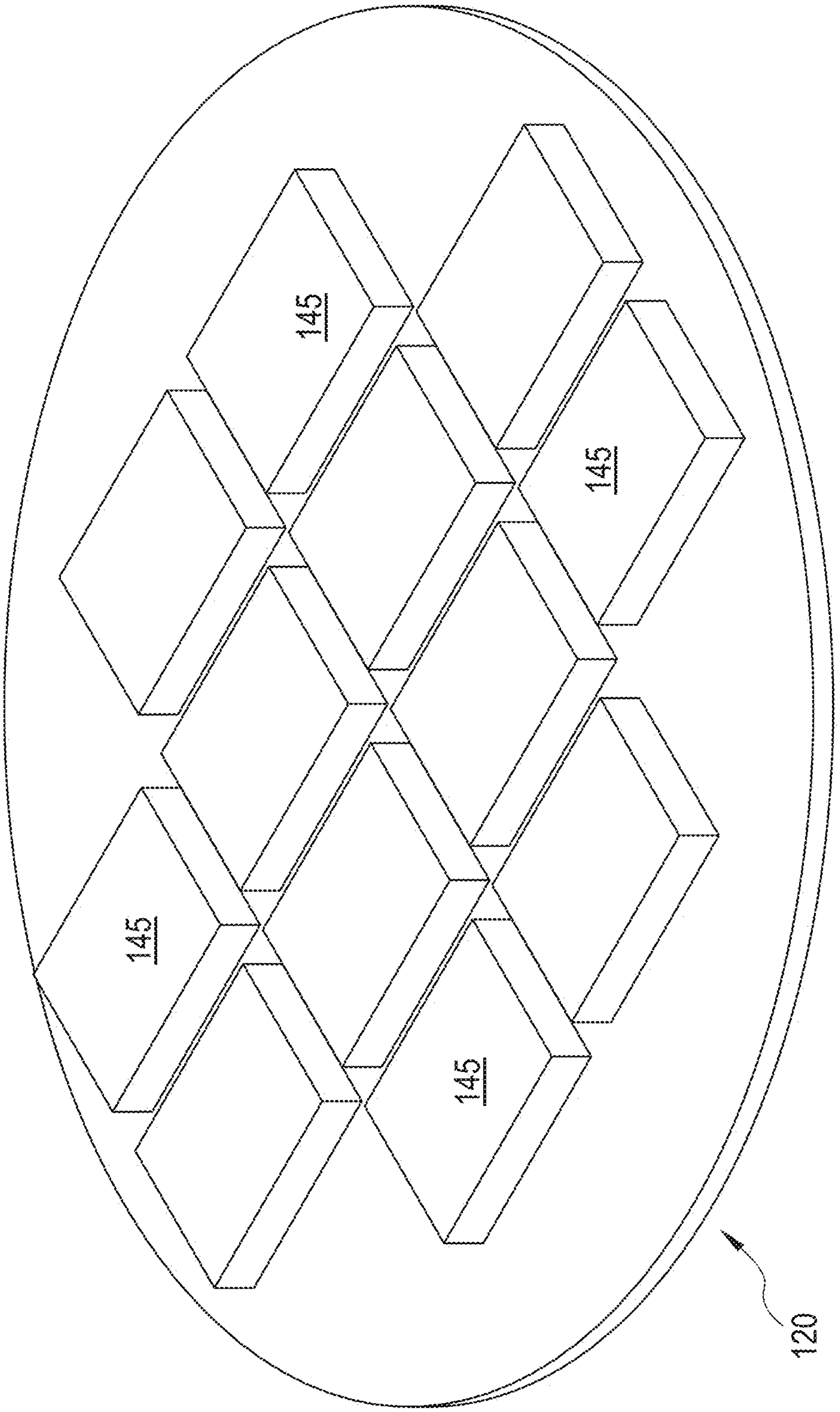
Figure 2K:
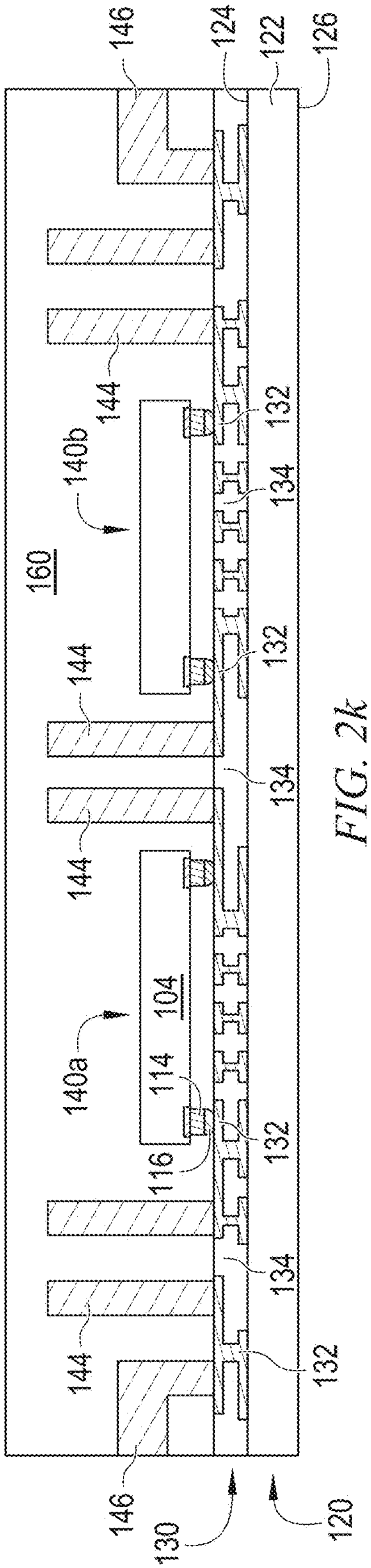
Figure 2L:
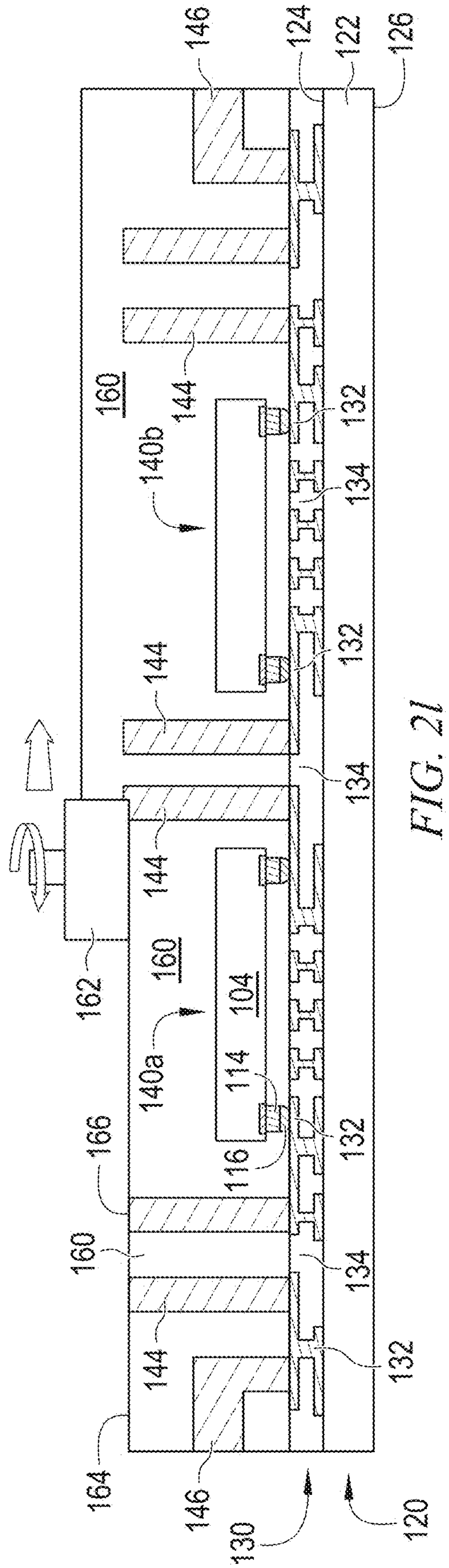
Figure 2M:
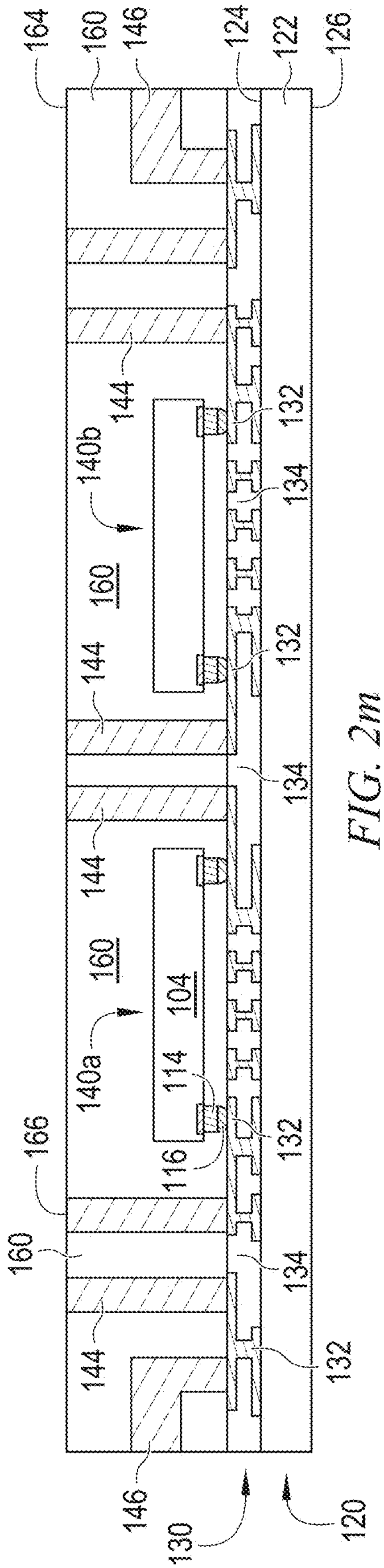
Figure 2N:
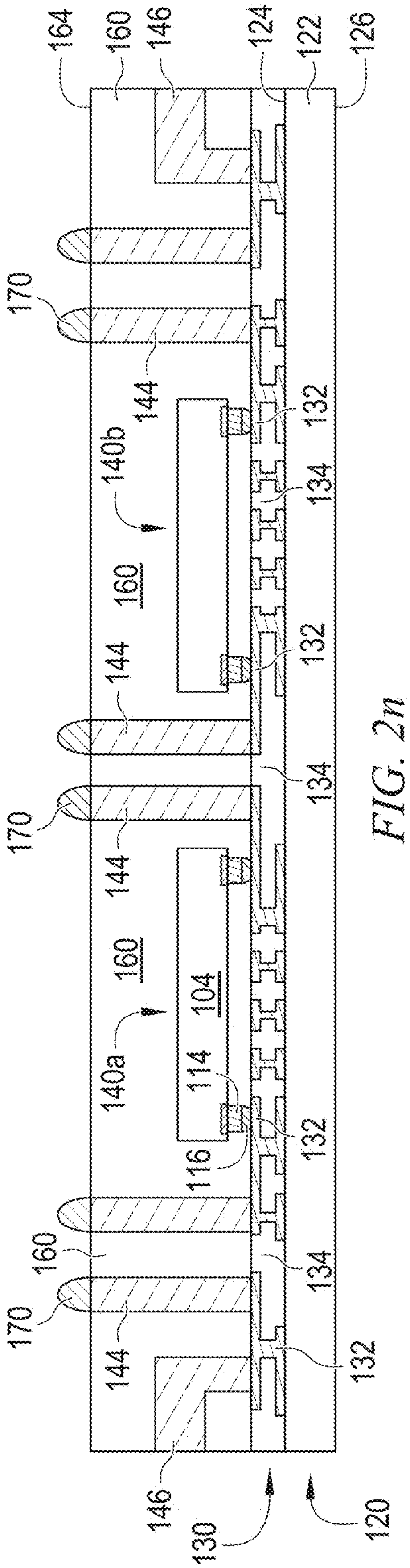
Figure 2O:
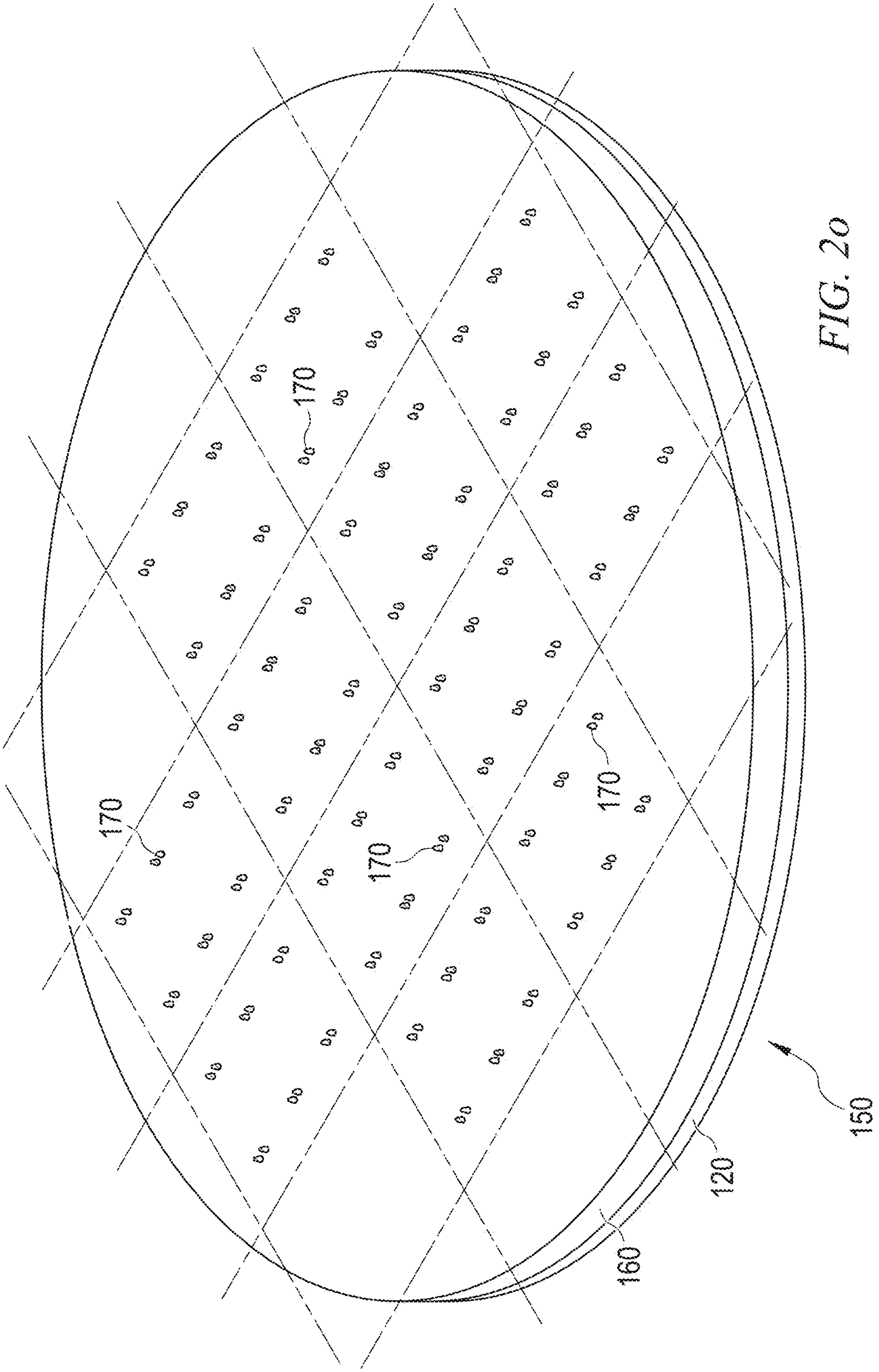
Figure 2P:
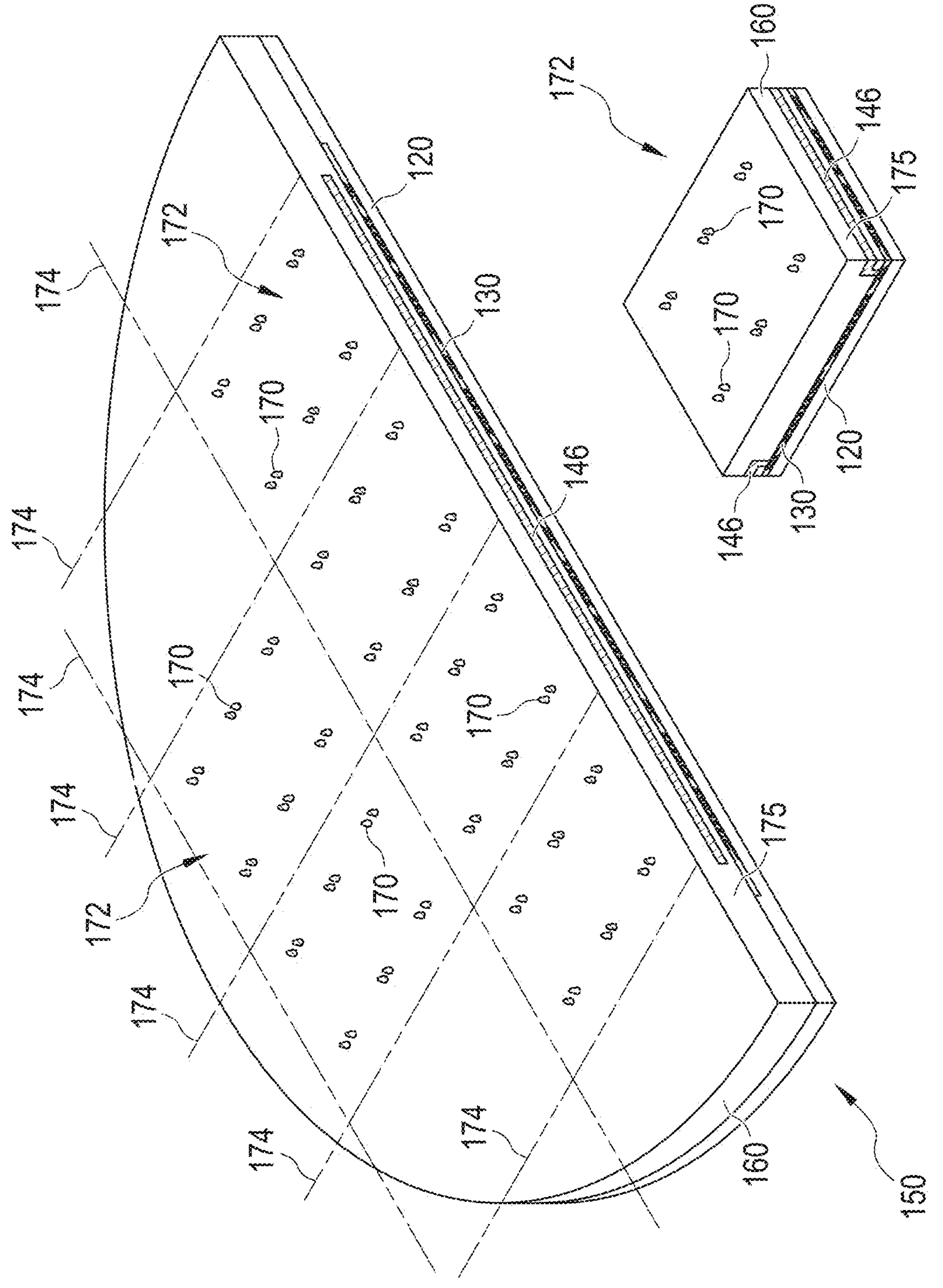
Figure 2Q:
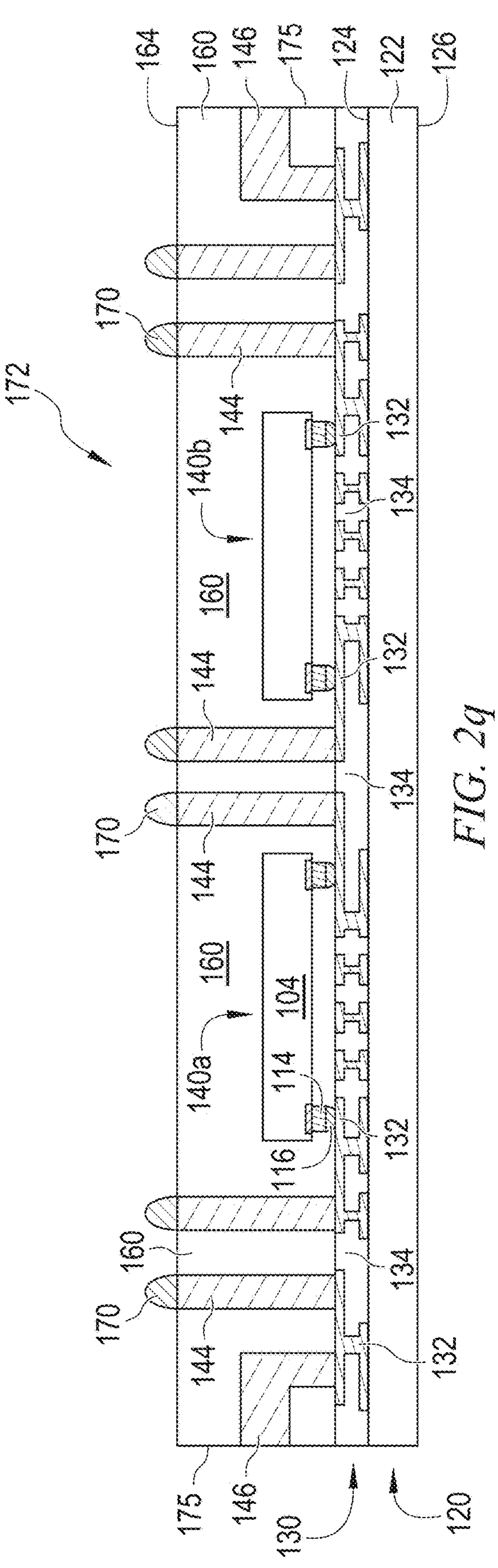
Figure 2R:
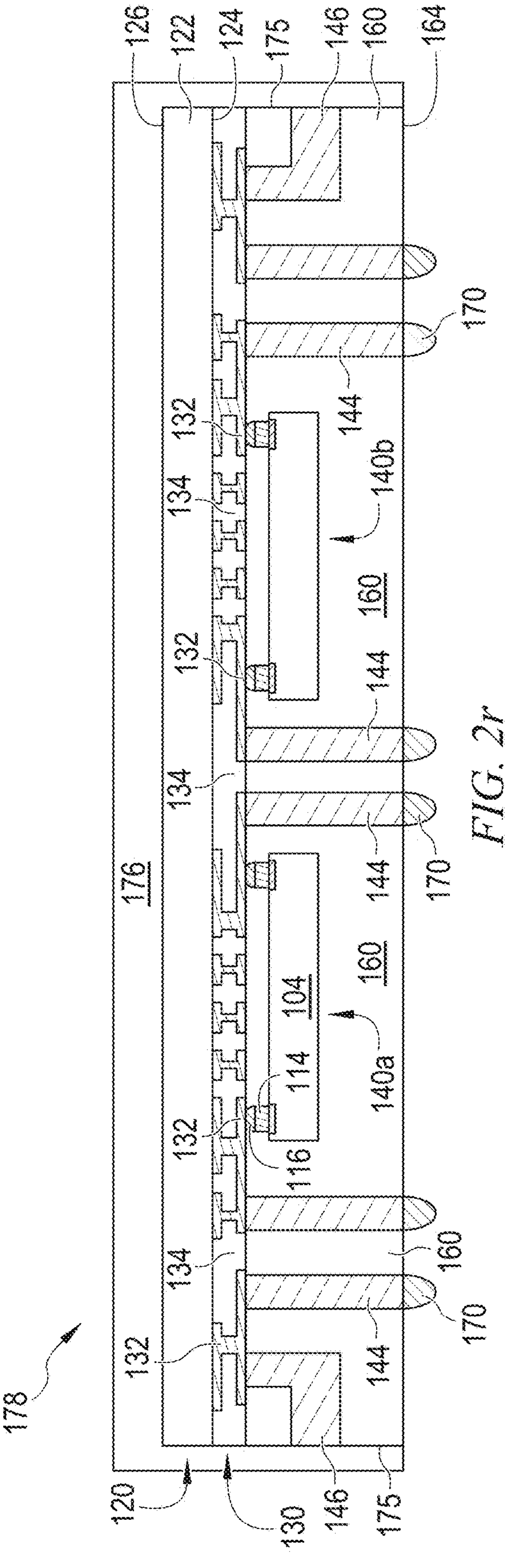
Figure 2S:
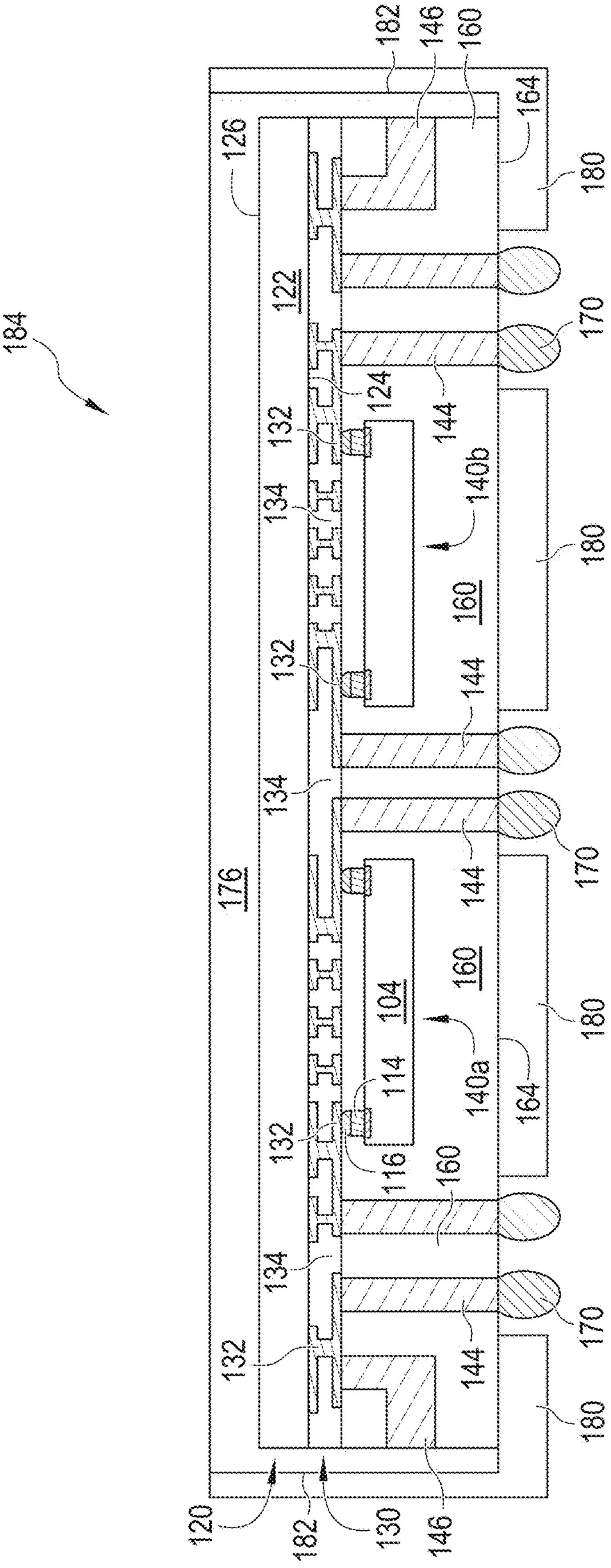

FIGS. 2*a*-2*s* illustrate a process of forming a C2W package with EMI shielding. FIG. 2*a* shows a cross-sectional view of a portion of substrate 120 including core material 122, such as silicon, germanium, aluminum phosphide, aluminum arsenide, gallium arsenide, gallium nitride, indium phosphide, silicon carbide, or other bulk material for structural support. Alternatively, core material 122 can be a multi-layer flexible laminate, ceramic, copper clad laminate (CCL), glass, or epoxy molding compound. Core material 122 may contain one or more layers of silicon dioxide (SiO2), silicon nitride (Si3N4), silicon oxynitride (SiON), tantalum pentoxide (Ta2O5), aluminum oxide (Al2O3), solder resist, polyimide, benzocyclobutene (BCB), polybenzoxazoles (PBO), and other material having similar insulating and structural properties. Substrate 120 has a major surface 124 and major surface 126 opposite surface 124.

FIG. 2*b* shows a cross-sectional view of a portion of interconnect substrate or interposer 130 formed over surface 124 of substrate 120. Interposer 130 includes one or more conductive layers 132 and one or more insulating layers 134. Conductive layers 132 can be one or more layers of Al, Cu, Sn, Ni, Au, Ag, or other suitable electrically conductive material. Conductive layers 132 can be formed using PVD, CVD, electrolytic plating, electroless plating process, or other suitable metal deposition process. Conductive layers 132 provide horizontal electrical interconnect across interposer 130 and vertical electrical interconnect between the top surface and bottom surface of interposer 130 as a redistribution layer (RDL). Portions of conductive layers 132 can be electrically common or electrically isolated depending on the design and function of semiconductor die 104 and other electrical components. Insulating layers 134 contains one or more layers of SiO2, Si3N4, SiON, Ta2O5, Al2O3, solder resist, polyimide, BCB, PBO, and other material having similar insulating and structural properties. Insulating layers 134 can be formed using PVD, CVD, printing, lamination, spin coating, spray coating, sintering or thermal oxidation. Insulating layers 134 provides isolation between conductive layers 132. There can be multiple conductive layers like 132 separated by insulating layers 134.

In another embodiment, conductive layers 132 and insulating layers 134 are individually formed over surface 124 of substrate 120 as interposer 130. For example, a first conductive layer 132 is formed, followed by a first insulating layer 134. Then a second conductive layer 132 is formed, followed by a second insulating layer 134, and so on.

In FIG. 2*c*, a plurality of electrical components 140*a*-140*b* is disposed on surface 136 of interposer 130 and electrically and mechanically connected to conductive layers 132. Electrical components 140*a*-140*b* are each positioned over interposer 130 using a pick and place operation. For example, electrical component 140*a*-140*b* can be similar to semiconductor die 104 from FIG. 1*c* with bumps 116 oriented toward surface 136 of substrate 130. Alternatively, electrical components 140*a*-140*b* can include other semiconductor die, semiconductor packages, surface mount devices, discrete electrical devices, interconnect structures, or IPDs.

Electrical components 140*a*-140*b* are brought into contact with surface 136 of interposer 130 and bonded to conductive layer 132 by reflowing bumps 116. FIG. 2*d* illustrates electrical components 140*a*-140*b* electrically and mechanically connected to conductive layers 132 of interposer 130, as disposed over substrate 120, as a C2W type assembly.

In FIG. 2*e*, a plurality of conductive posts or columns or pillars 144 is formed over surface 136 of interposer 130. Conductive pins 146 are also formed over surface 136 of interposer 130. Conductive posts 144 and conductive pins 146 can be pre-fabricated and then bonded to surface 136 with solder or conductive paste. The assembly shown in FIG. 2*e* is referenced as assembly 145.

In another embodiment, conductive posts 144 and conductive pins 146 can be formed prior to mounting electrical components 140*a*-140*b*. For example, in FIG. 2*f*, photoresist layer 147 is formed over surface 136 of interposer 130. In FIG. 2*g*, a portion of photoresist layer 147 is removed by an etching process or laser direct ablation (LDA) to form openings 148 in the locations of conductive posts 144 and conductive pins 146. In FIG. 2*h*, openings 148 are filled with conductive material 149, such as Al, Cu, Sn, Ni, Au, Ag, or other suitable electrically conductive material. In FIG. 2*i*, photoresist layer 147 is removed leaving conductive posts 144 and conductive pins 146. Electrical components 140*a*-140*b* can be added returning to the state of assembly 145 in FIG. 2*e*.

Substrate 120, interposer 130, and assemblies 145 are in the form of wafer or strip 150, as shown in FIG. 2*j*. In FIG. 2*j*, assembly 145 is shown as a block for simplification of explanation, although it is understood that block 145 in FIG. 2*j* is the same as assembly 145 in FIG. 2*e* or 2*i*. Each assembly 145 includes a portion of substrate 120 and a portion of interposer 130, electrical components 140*a*-140*b*, conductive posts 144, and conductive pins 146.

In FIG. 2*k*, an encapsulant or molding compound 160 is deposited over and around electrical components 140*a*-140*b*, conductive posts 144, conductive pins 146, and surface 136 of interposer 130 using a paste printing, compressive molding, transfer molding, liquid encapsulant molding, vacuum lamination, spin coating, or other suitable applicator. Encapsulant 160 can be polymer composite material, such as epoxy resin with filler, epoxy acrylate with filler, or polymer with proper filler. Encapsulant 160 is non-conductive, provides structural support, and environmentally protects the semiconductor device from external elements and contaminants.

In FIG. 2*l*, a portion of encapsulant 160 is removed by grinder 162 to planarize surface 164 of encapsulant 160 and expose surface 166 of conductive posts 144. FIG. 2*m* shows encapsulant 160 post grinding with planarized surface 164 and exposed surface 166 of conductive posts 144.

In FIG. 2*n*, an electrically conductive bump material is deposited over conductive posts 144 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive post 144 using a suitable attachment or bonding process. In one embodiment, the bump material is reflowed by heating the material above its melting point to form balls or bumps 170. In one embodiment, bump 170 is formed over a UBM having a wetting layer, barrier layer, and adhesive layer. Bump 170 can also be compression bonded or thermocompression bonded to conductive post 144. Bump 170 represents one type of interconnect structure that can be formed over conductive post 144. The interconnect structure can also use bond wires, conductive paste, stud bump, micro bump, or other electrical interconnect.

FIG. 20 illustrates wafer 150 with encapsulant 160 and bumps 170. In FIG. 2*p*, wafer 150 is singulated into individual C2W packages 172 along saw streets 174, each including a portion of substrate 120, a portion of interposer 130, electrical components 140*a*-140*b*, conductive posts 144, conductive pins 146, encapsulant 160, and bumps 170. FIG. 2*q* shows C2W package 172 post singulation. Note that conductive pins 146 are exposed from surface 175 of encapsulant 160.

Electrical components 140*a*-140*b* may contain IPDs that are susceptible to or generate EMI, RFI, harmonic distortion, and inter-device interference. For example, the IPDs contained within electrical components 140*a*-140*b* may provide the electrical characteristics needed for high-frequency applications, such as resonators, high-pass filters, low-pass filters, band-pass filters, symmetric Hi-Q resonant transformers, and tuning capacitors. In another embodiment, electrical components 140*a*-140*b* may contain digital circuits switching at a high frequency, which could interfere with the operation of IPDs in C2W package 172 or other IPD in proximity thereto.

To address EMI, RFI, harmonic distortion, and inter-device interference, shielding material 176 is deposited over surface 126 of substrate 120, as well as surface 175 of encapsulant 160, as shown in FIG. 2*r*. Electromagnetic shielding material 176 can be one or more layers of Al, Cu, Sn, Ni, Au, Ag, or other suitable conductive material. Alternatively, electromagnetic shielding material 176 can be carbonyl iron, stainless steel, nickel silver, low-carbon steel, silicon-iron steel, foil, conductive resin, carbon-black, and aluminum flake. In yet another embodiment shielding material 176 can be ferromagnetic materials, Ni, Fe, Ni—Fe alloys, amorphous metal alloys, nanocrystalline metal alloys, magnetic sheets, and other metals and composites capable of reducing or inhibiting the effects of EMI, RFI, and other inter-device interference. Shielding material 176 can be formed as multiple layers of conductive and magnetic material. Shielding material 176 is grounded through conductive pins 146, as exposed from surface 175 of encapsulant 160, conductive layer 132, conductive post 144, and bumps 170 to an external ground. The assembly shown in FIG. 2*r* is referenced as C2W package 178.

In another embodiment, shielding material 180 is deposited over surface 182 of shielding material 176, as well as surface 164 of encapsulant 160 between bumps 170, as shown in FIG. 2*s*. Electromagnetic shielding material 180 can be one or more layers of Al, Cu, Sn, Ni, Au, Ag, or other suitable conductive material. Alternatively, electromagnetic shielding material 180 can be carbonyl iron, stainless steel, nickel silver, low-carbon steel, silicon-iron steel, foil, conductive resin, carbon-black, aluminum flake, and other metals and composites capable of reducing or inhibiting the effects of EMI, RFI, and other inter-device interference. Shielding material 180 is grounded through shielding material 176, conductive pins 146, as exposed from surface 175 of encapsulant 160, conductive layer 132, conductive post 144, and bumps 170 to an external ground. The assembly shown in FIG. 2*s* is referenced as C2W package 184.

C2W packages 178 and 184 each contain electrical components 140*a*-140*b*, conductive posts 144, conductive pins 146, interposer 130, encapsulant 160, and shielding material 176 to reduce or inhibit the effects of EMI, RFI, and other inter-device interference. Shielding material 176 is grounded through conductive pins 146, as exposed from surface 175 of encapsulant 160, conductive layer 132, conductive post 144, and bumps 170 to an external ground. C2W package 184 further contains shielding material 180 to reduce or inhibit the effects of EMI, RFI, and other inter-device interference. Shielding material 180 is grounded through shielding material 176, conductive pins 146, as exposed from surface 175 of encapsulant 160, conductive layer 132, conductive post 144, and bumps 170 to an external ground.

Figure 3A:
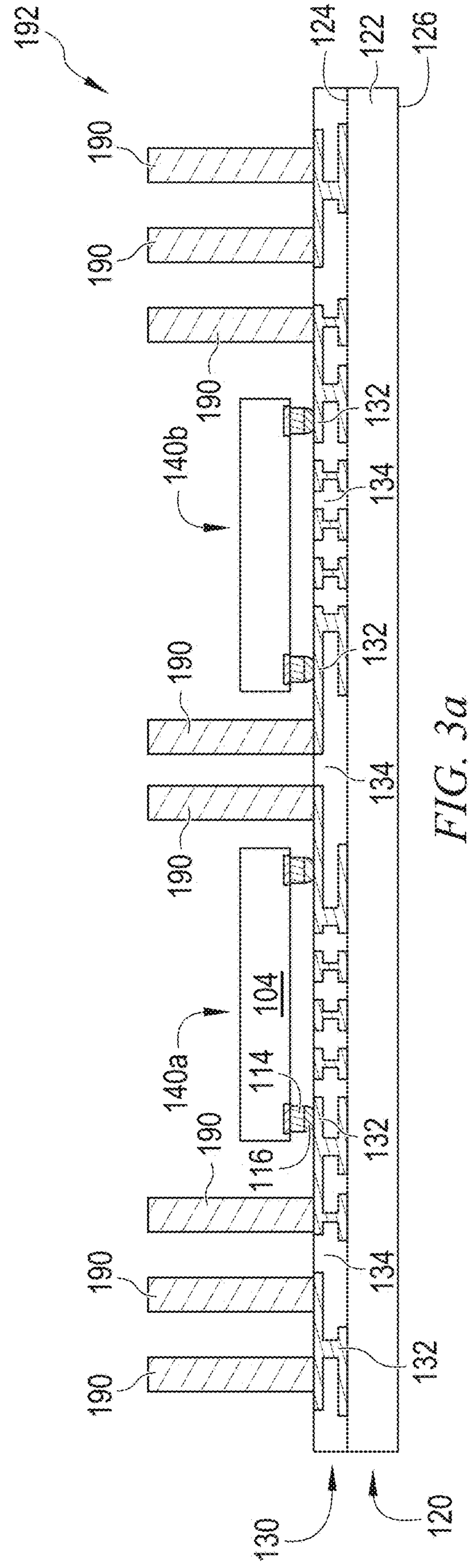
FIGS. 3*a*-3*h* illustrate another process of forming a C2W package with shielding grounded through conductive posts.

In another embodiment, continuing from FIG. 2*b*, conductive posts 190 are formed over surface 136 of interposer 130, as shown in FIG. 3*a*. Conductive posts 190 can be formed as described in FIG. 2*e*, or as described in FIGS. 2*f*-2*i*. Electrical components 140*a*-140*b* are mounted to surface 136 as described in FIGS. 2*c*-2*d*, or as described in FIGS. 2*f*-2*i*, in a C2W type assembly. Electrical components 140*a*-140*b* can be mounted to surface 136 prior to or after forming conductive posts 190. The assembly shown in FIG. 3*a* is referenced as assembly 192. Substrate 120, interposer 130, and assemblies 192 are in the form of a wafer or strip, similar to FIG. 2*j*.

Figure 3B:
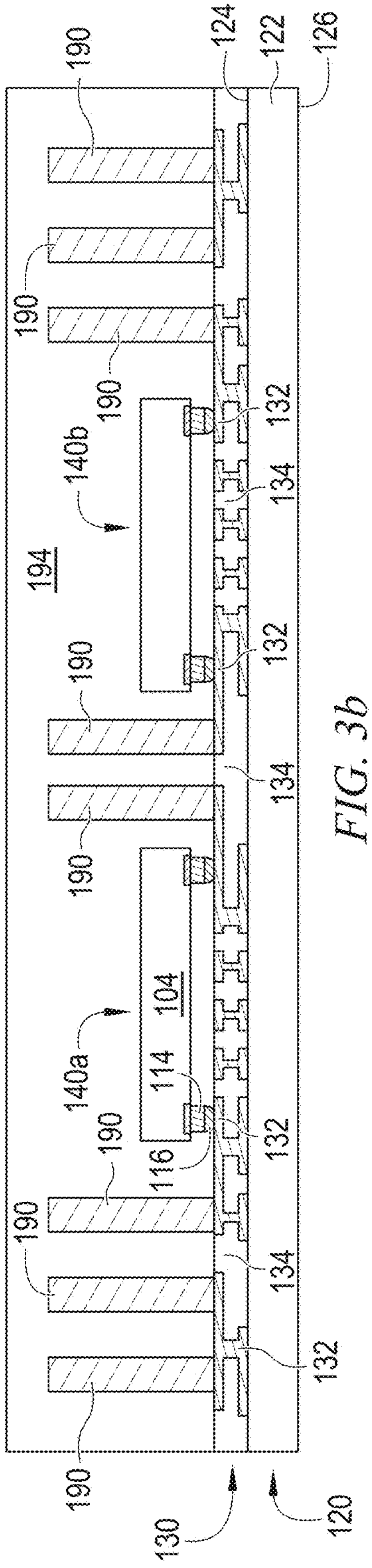

In FIG. 3*b*, an encapsulant or molding compound 194 is deposited over and around electrical components 140*a*-140*b*, conductive posts 190, and surface 136 of interposer 130 using a paste printing, compressive molding, transfer molding, liquid encapsulant molding, vacuum lamination, spin coating, or other suitable applicator. Encapsulant 194 can be polymer composite material, such as epoxy resin with filler, epoxy acrylate with filler, or polymer with proper filler. Encapsulant 194 is non-conductive, provides structural support, and environmentally protects the semiconductor device from external elements and contaminants.

Figure 3C:
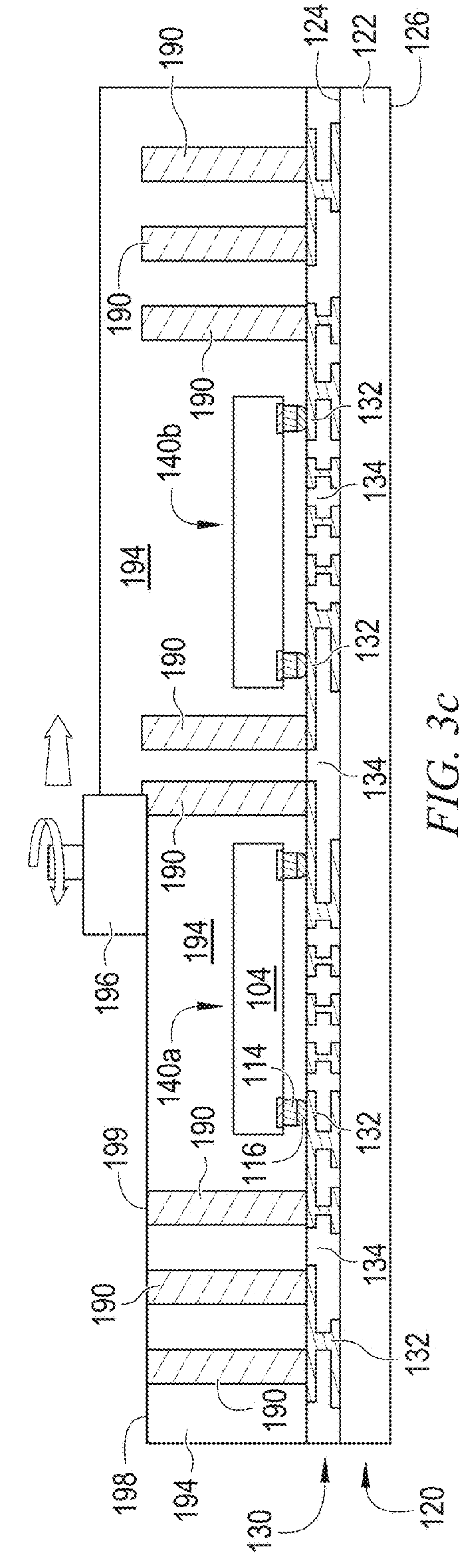
Figure 3D:
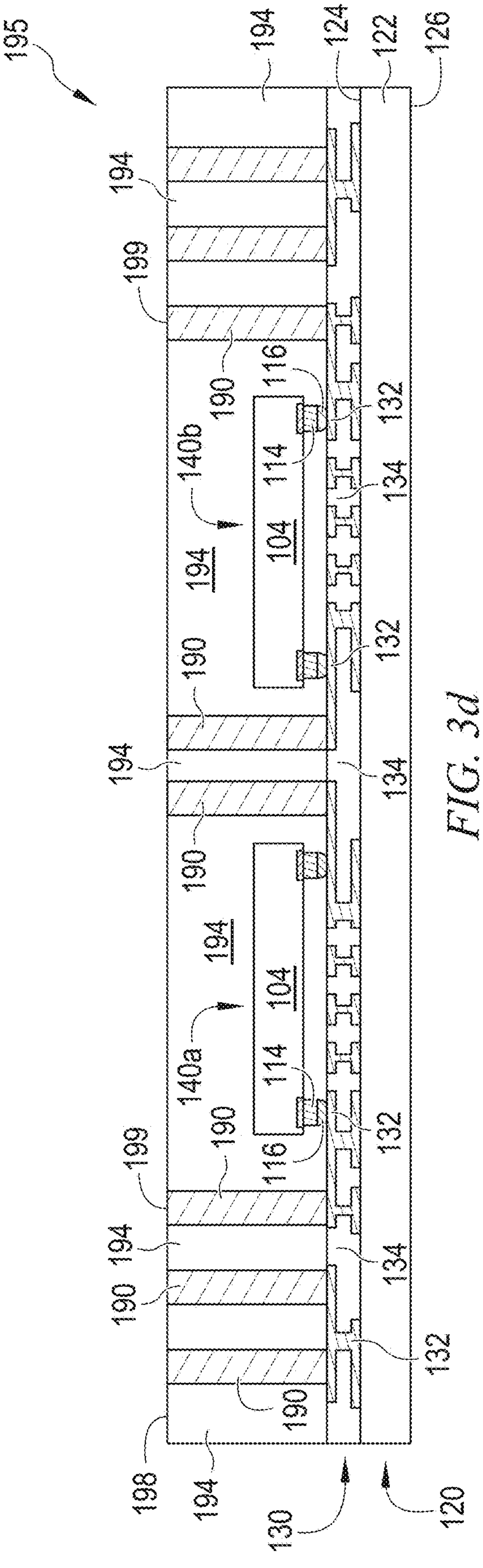

In FIG. 3*c*, a portion of encapsulant 194 is removed by grinder 196 to planarize surface 198 of encapsulant 194 and expose surface 199 of conductive posts 190. FIG. 3*d* shows encapsulant 190 post grinding with planarized surface 196 and exposed surface 199 of conductive posts 190. A perspective view of the full wafer or strip with planarized encapsulant 194 would be similar to FIG. 2O. The wafer or strip would be singulated as described in FIG. 2*p*, leaving individual assemblies 195 each, containing a portion of substrate 120 and a portion of interposer 130, electrical components 140*a*-140*b*, conductive posts 144, and encapsulant 194.

Figure 3E:
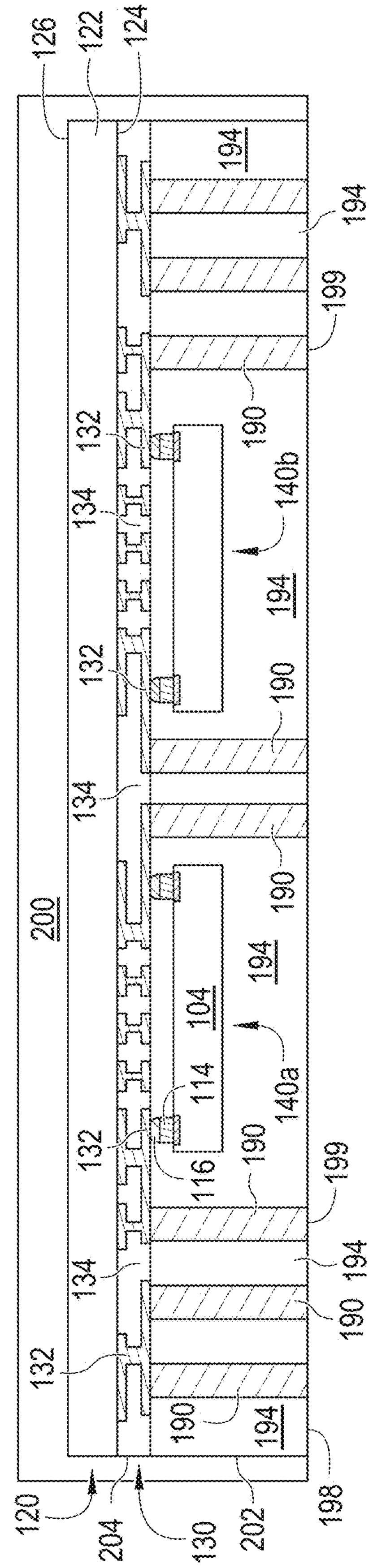

To address EMI, RFI, harmonic distortion, and inter-device interference, shielding material 200 is deposited over surface 126 of substrate 120, as well as surface 202 of encapsulant 194 and surface 204 of interposer 130, as shown in FIG. 3*e*. Electromagnetic shielding material 200 can be one or more layers of Al, Cu, Sn, Ni, Au, Ag, or other suitable conductive material. Alternatively, electromagnetic shielding material 200 can be carbonyl iron, stainless steel, nickel silver, low-carbon steel, silicon-iron steel, foil, conductive resin, carbon-black, and aluminum flake. In yet another embodiment shielding material 200 can be ferromagnetic materials, Ni, Fe, Ni—Fe alloys, amorphous metal alloys, nanocrystalline metal alloys, magnetic sheets, and other metals and composites capable of reducing or inhibiting the effects of EMI, RFI, and other inter-device interference. Shielding material 200 can be formed as multiple layers of conductive and magnetic material.

Figure 3F:
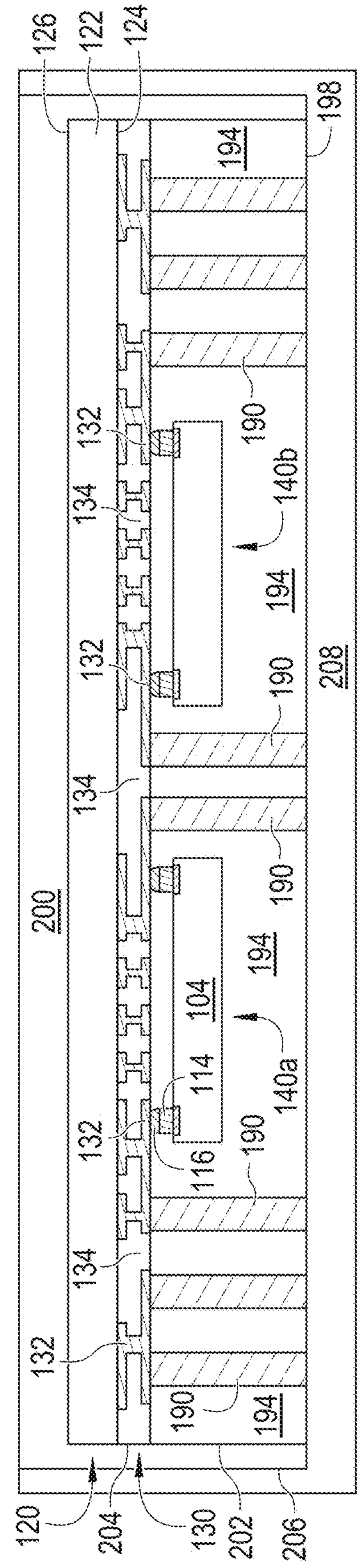

In FIG. 3*f*, shielding material 208 is deposited over surface 206 of shielding material 200, as well as surface 198 of encapsulant 194. Electromagnetic shielding material 208 can be one or more layers of Al, Cu, Sn, Ni, Au, Ag, or other suitable conductive material. Alternatively, electromagnetic shielding material 208 can be carbonyl iron, stainless steel, nickel silver, low-carbon steel, silicon-iron steel, foil, conductive resin, carbon-black, aluminum flake, and other metals and composites capable of reducing or inhibiting the effects of EMI, RFI, and other inter-device interference.

Figure 3G:
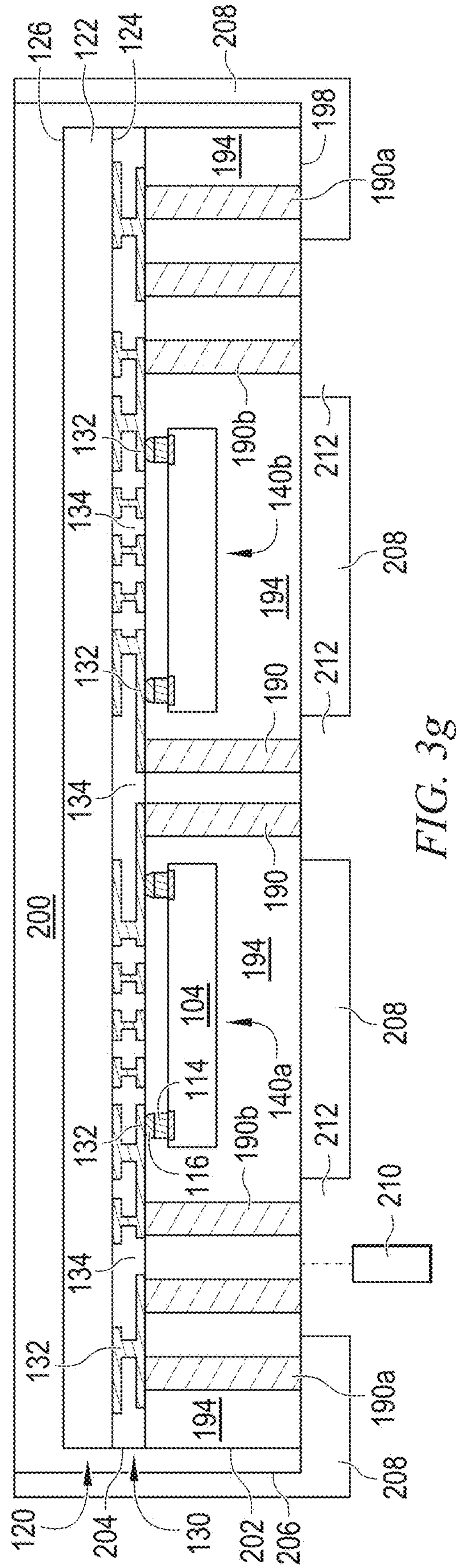
Figure 3H:
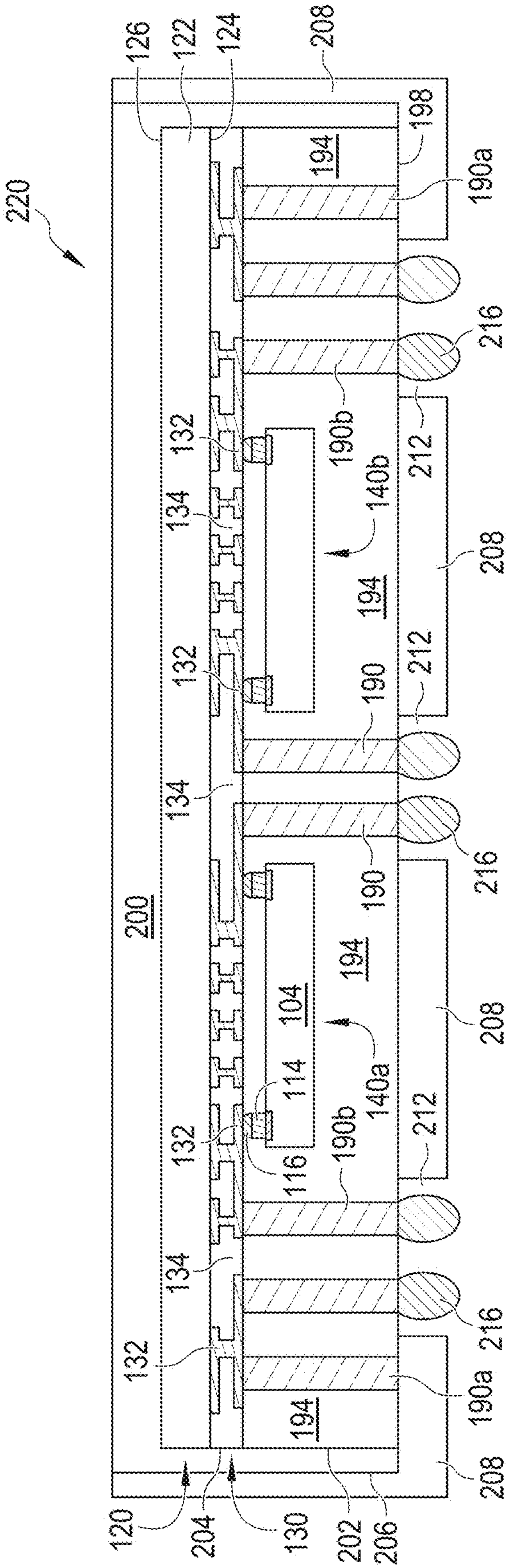

In FIG. 3*g*, a portion of shielding material 208 is removed by an etching process or LDA using laser 210. In FIG. 3*h*, an electrically conductive bump material is deposited over conductive posts 190 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive post 190 using a suitable attachment or bonding process. In one embodiment, the bump material is reflowed by heating the material above its melting point to form balls or bumps 216. In one embodiment, bump 216 is formed over a UBM having a wetting layer, barrier layer, and adhesive layer. Bump 216 can also be compression bonded or thermocompression bonded to conductive post 190. Bump 216 represents one type of interconnect structure that can be formed over conductive post 190. The interconnect structure can also use bond wires, conductive paste, stud bump, micro bump, or other electrical interconnect.

Shielding material 208 is grounded through conductive posts 190*a*, conductive layer 132, conductive posts 190*b*, and bumps 216 to an external ground. Shielding material 200 is grounded through shielding material 208, conductive posts 190*a*, conductive layer 132, conductive posts 190*b*, and bumps 216 to an external ground. The assembly shown in FIG. 3*h* is referenced as C2W package 220.

Figure 4:
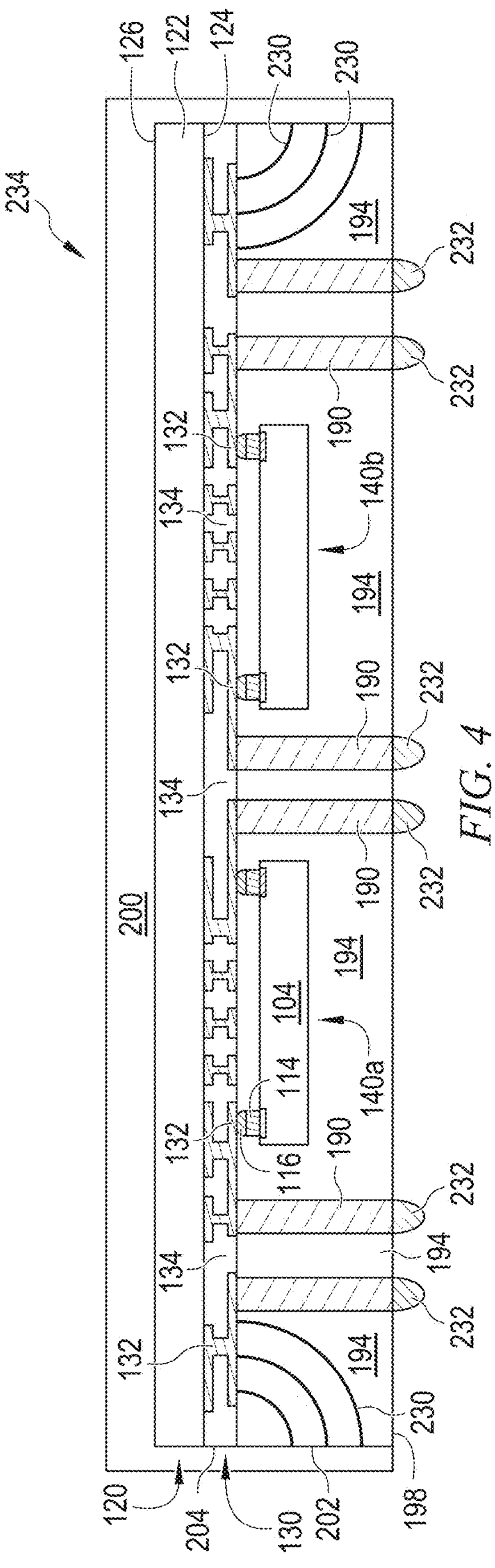
FIG. 4 illustrates a C2W package grounded through conductive wires embedded in the encapsulant.

In another embodiment, similar to FIG. 3*e*, shielding material 200 is grounded through conductive wires 230 embedded within encapsulant 194, conductive layer 132, conductive post 190, and bumps 232 to an external ground, as shown in FIG. 4. The assembly shown in FIG. 4 is referenced as C2W package 234.

Figure 5:
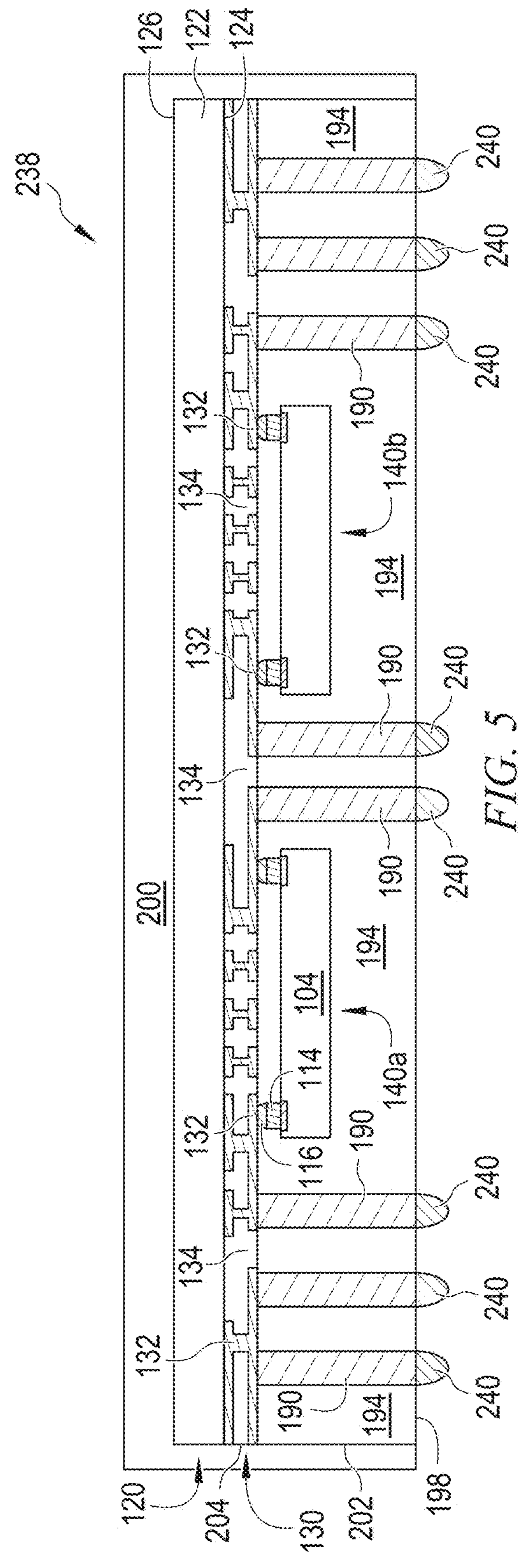
FIG. 5 illustrates a C2W package grounded through conductive layers in the interposer.

In another embodiment, similar to FIG. 3*e*, shielding material 200 is grounded through conductive layer 132, as exposed from surface 204 of interposer 130, conductive post 190, and bumps 240 to an external ground, as shown in FIG. 5. The assembly shown in FIG. 5 is referenced as C2W package 238.

Figure 6:
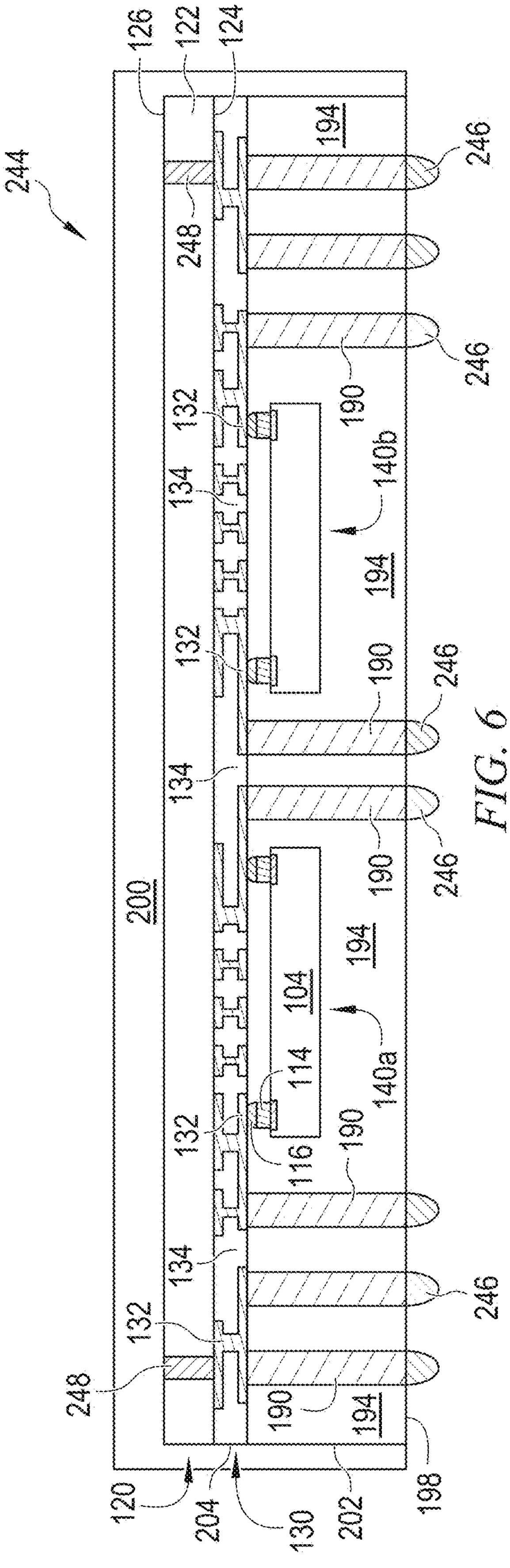
FIG. 6 illustrates a C2W package grounded through conductive vias formed through the substrate.

In another embodiment, similar to FIG. 3*e*, shielding material 200 is grounded through conductive vias 248, as formed through substrate 120, conductive layer 132, conductive post 190, and bumps 246 to an external ground, as shown in FIG. 6. The assembly shown in FIG. 6 is referenced as C2W package 244.

Figure 7A:
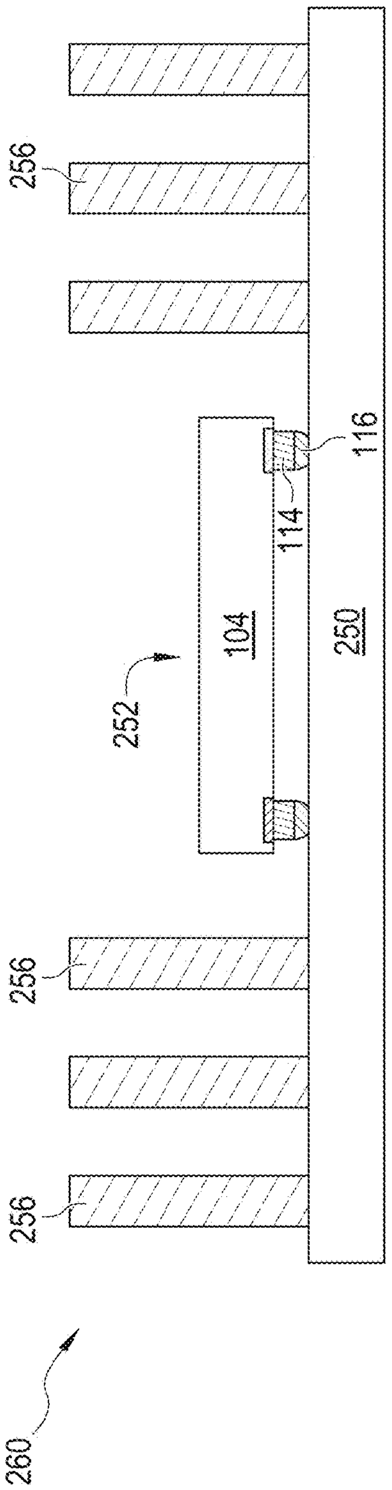
FIGS. 7*a*-7*l* illustrate another process of forming a C2W package with shielding grounded through conductive layers in the interposer.

In another embodiment, FIG. 7*a* shows a cross-sectional view of a portion of wafer or strip substrate 250, similar to substrate 120. Electrical component 252 is mounted to substrate 250, similar to electrical components 140*a*-140*b*, as a C2W type assembly. Conductive posts 256 are formed on substrate 250, similar to conductive posts 144. The assembly shown in FIG. 7*a* is referenced as assembly 260.

Figure 7B:
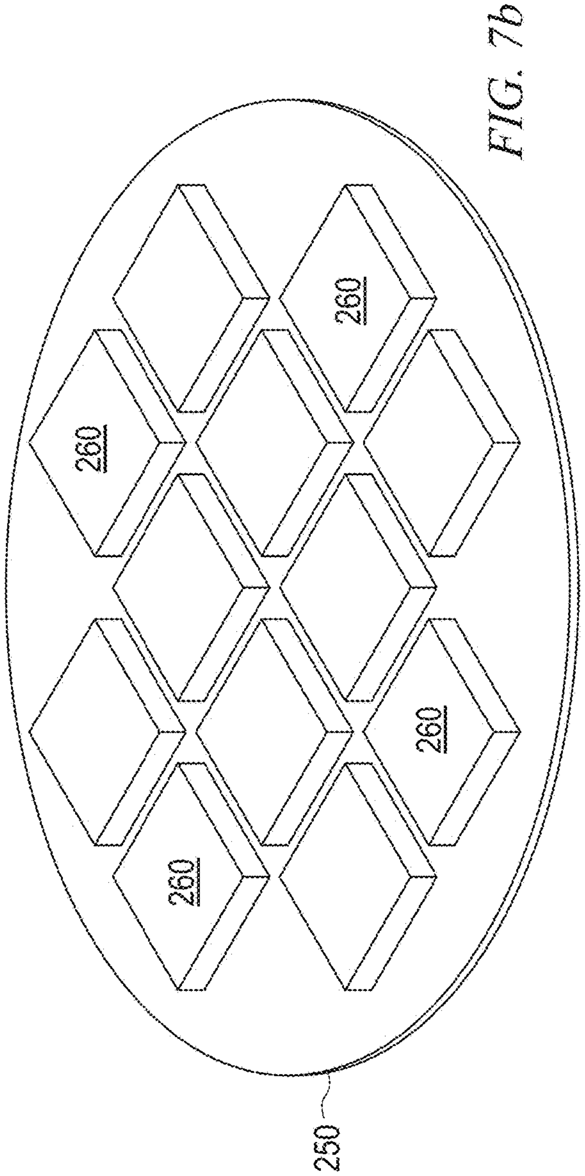
Figure 7C:
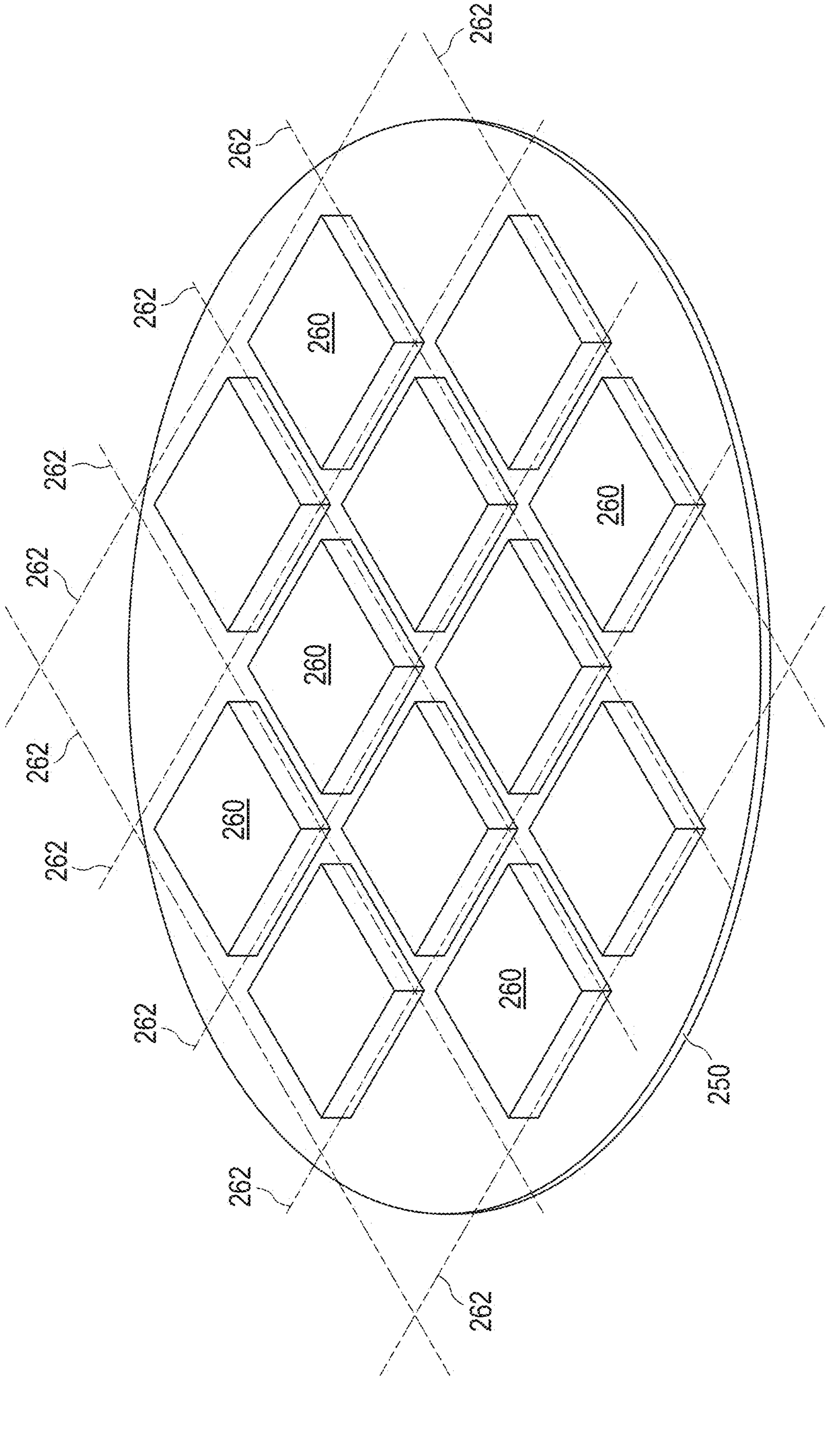

FIG. 7*b* shows the full wafer 250 with a plurality of assemblies 260. In FIG. 7*b*, assembly 260 is shown as a block for simplification of explanation, although it is understood that block 260 in FIG. 7*b* is the same as assembly 260 in FIG. 7*a*. In FIG. 7*c*, wafer 250 is singulated along saw streets 262 using a saw blade or laser cutting tool into individual assemblies 260, each assembly containing a portion of substrate 250, electrical component 252, and conductive posts 256 disposed around the electrical component, as in FIG. 7*a*.

Figure 7D:
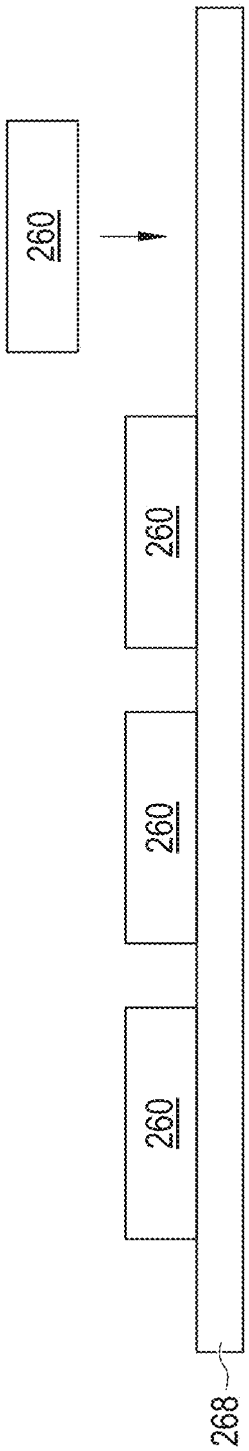
Figure 7E:
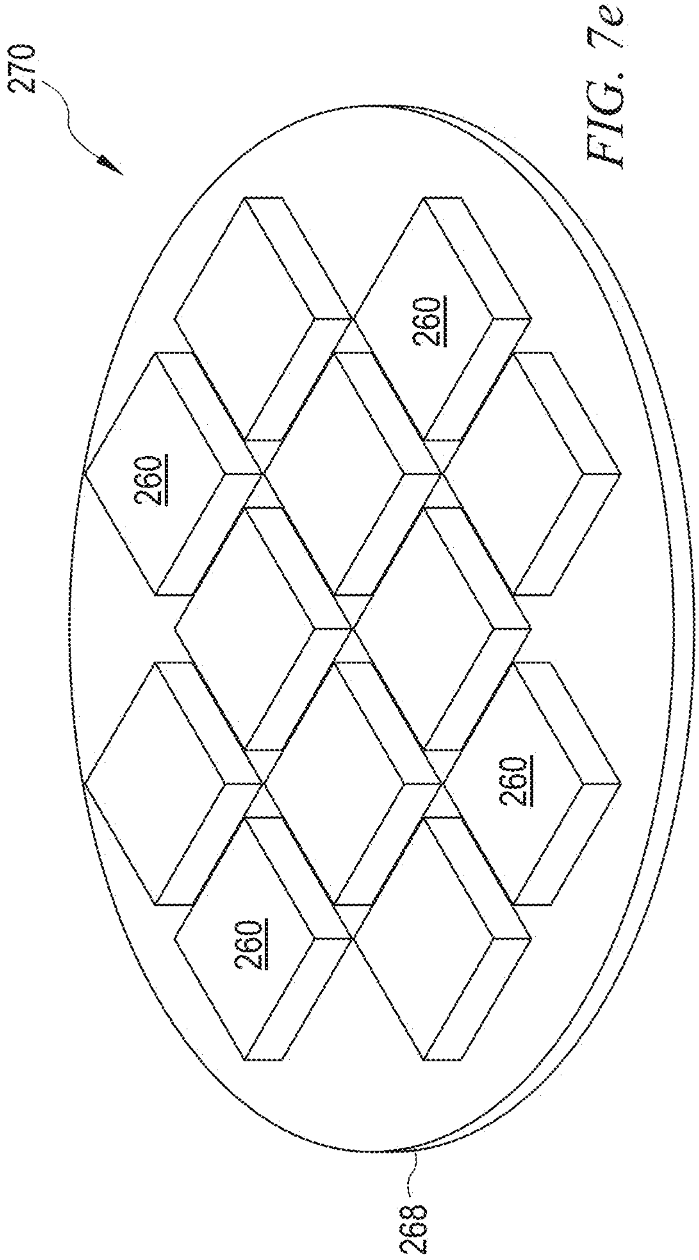

In FIG. 7*d*, the singulated assemblies 260 are mounted to temporary carrier 268 with an adhesive to form reconstituted wafer 270. FIG. 7*e* shows a perspective view of assemblies 260 mounted to carrier 268 as reconstituted wafer 270.

Figures 7F, 7G, 7H:
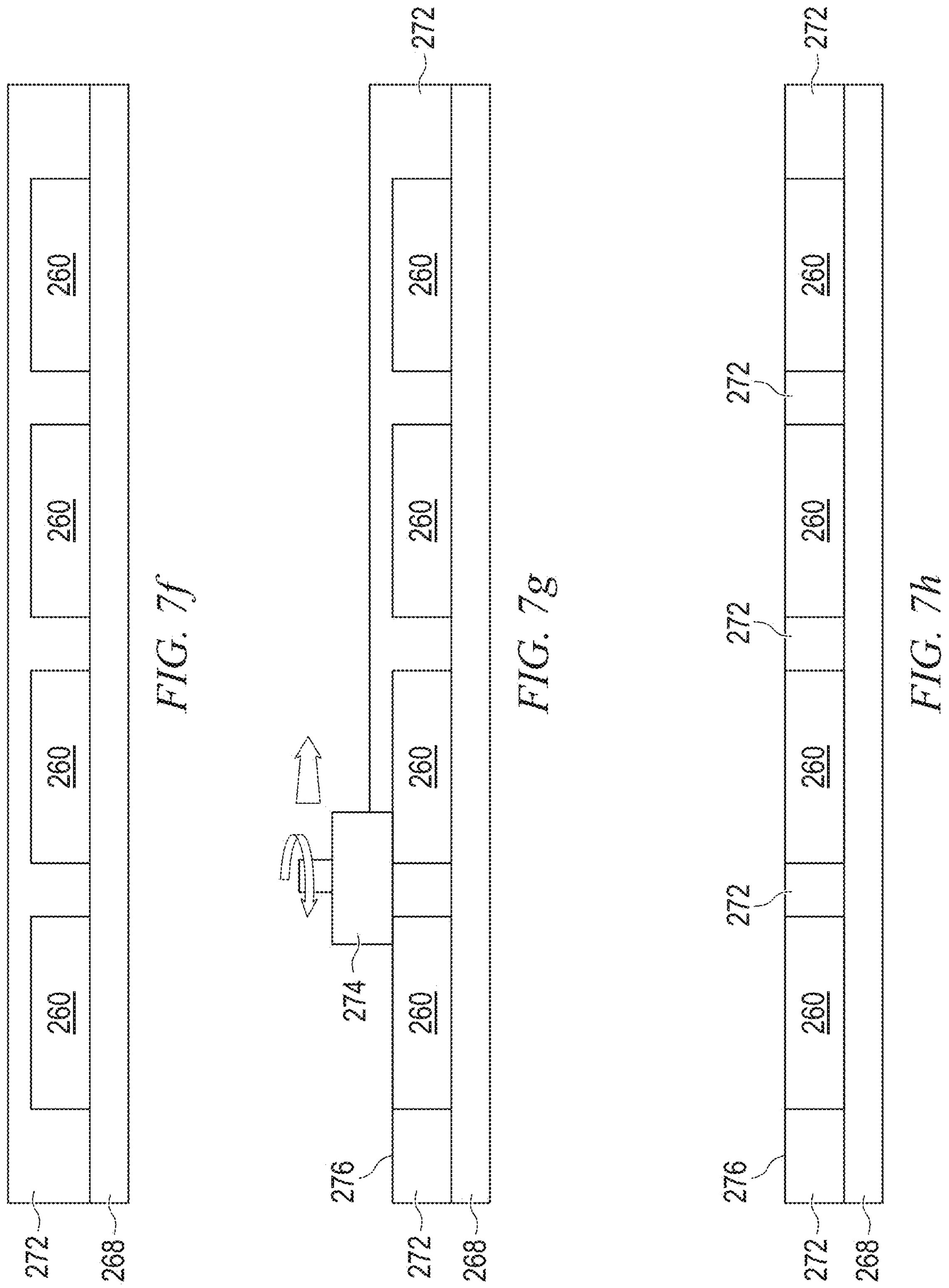

In FIG. 7*f*, an encapsulant or molding compound 272 is deposited over and around assemblies 260, each with electrical component 252, conductive posts 256, and a portion of carrier 267, using a paste printing, compressive molding, transfer molding, liquid encapsulant molding, vacuum lamination, spin coating, or other suitable applicator. Encapsulant 272 can be polymer composite material, such as epoxy resin with filler, epoxy acrylate with filler, or polymer with proper filler. Encapsulant 272 is non-conductive, provides structural support, and environmentally protects the semiconductor device from external elements and contaminants.

In FIG. 7*g*, a portion of encapsulant 272 is removed by grinder 274 to planarize surface 276 of encapsulant 272 and expose a top surface of conductive posts 256. FIG. 7*h* shows encapsulant 272 post grinding with planarized surface 276.

Figure 7I:
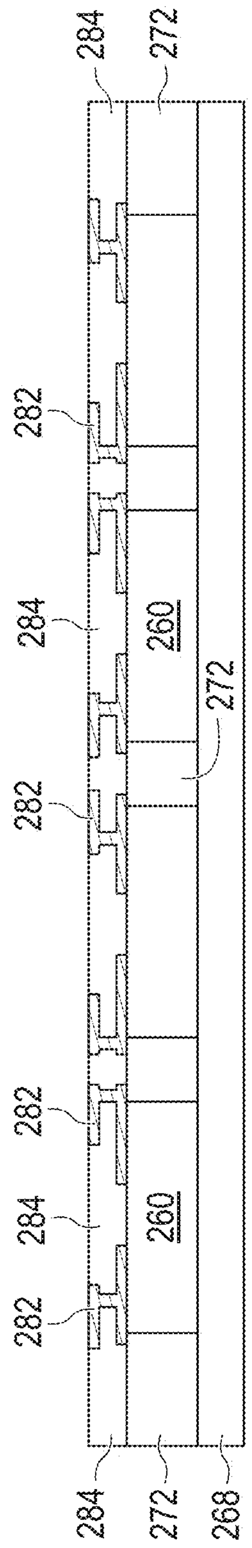

In FIG. 7*i*, interconnect substrate or interposer 280 is formed over assemblies 260 and encapsulant 272. Interposer 280 includes one or more conductive layers 282 and one or more insulating layers 284. Conductive layers 282 can be one or more layers of Al, Cu, Sn, Ni, Au, Ag, or other suitable electrically conductive material. Conductive layers 282 can be formed using PVD, CVD, electrolytic plating, electroless plating process, or other suitable metal deposition process. Conductive layers 282 provide horizontal electrical interconnect across interposer 280 and vertical electrical interconnect between the top surface and bottom surface of interposer 280 as an RDL. Portions of conductive layers 282 can be electrically common or electrically isolated depending on the design and function of semiconductor die 104 and other electrical components. Insulating layers 284 contains one or more layers of SiO2, Si3N4, SiON, Ta2O5, Al2O3, solder resist, polyimide, BCB, PBO, and other material having similar insulating and structural properties. Insulating layers 284 can be formed using PVD, CVD, printing, lamination, spin coating, spray coating, sintering or thermal oxidation. Insulating layers 284 provides isolation between conductive layers 282. There can be multiple conductive layers like 282 separated by insulating layers 284.

Figure 7J:
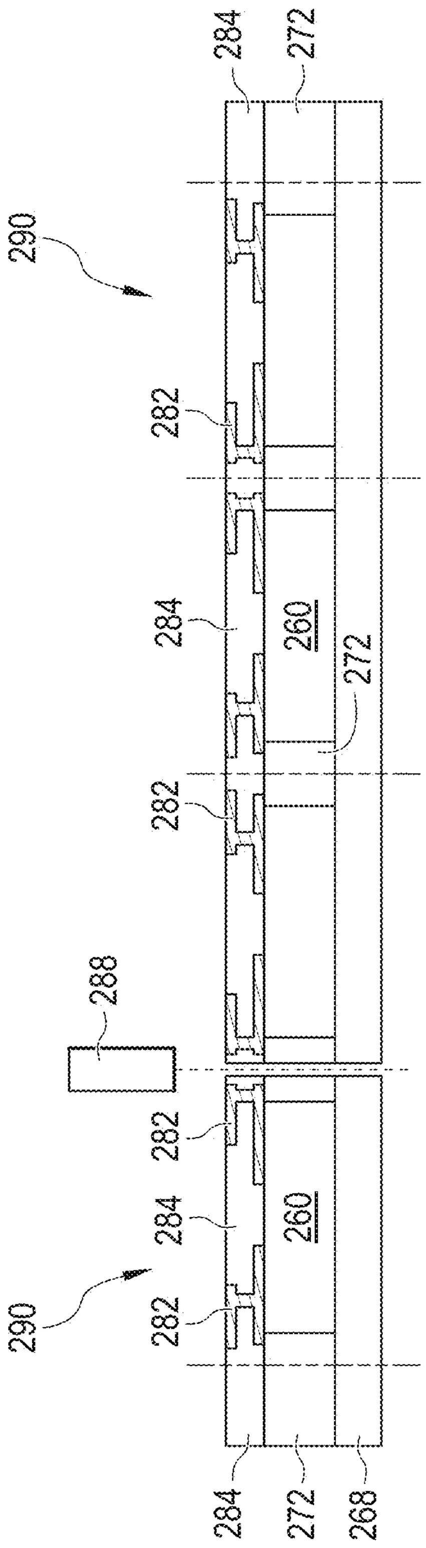
Figure 7K:
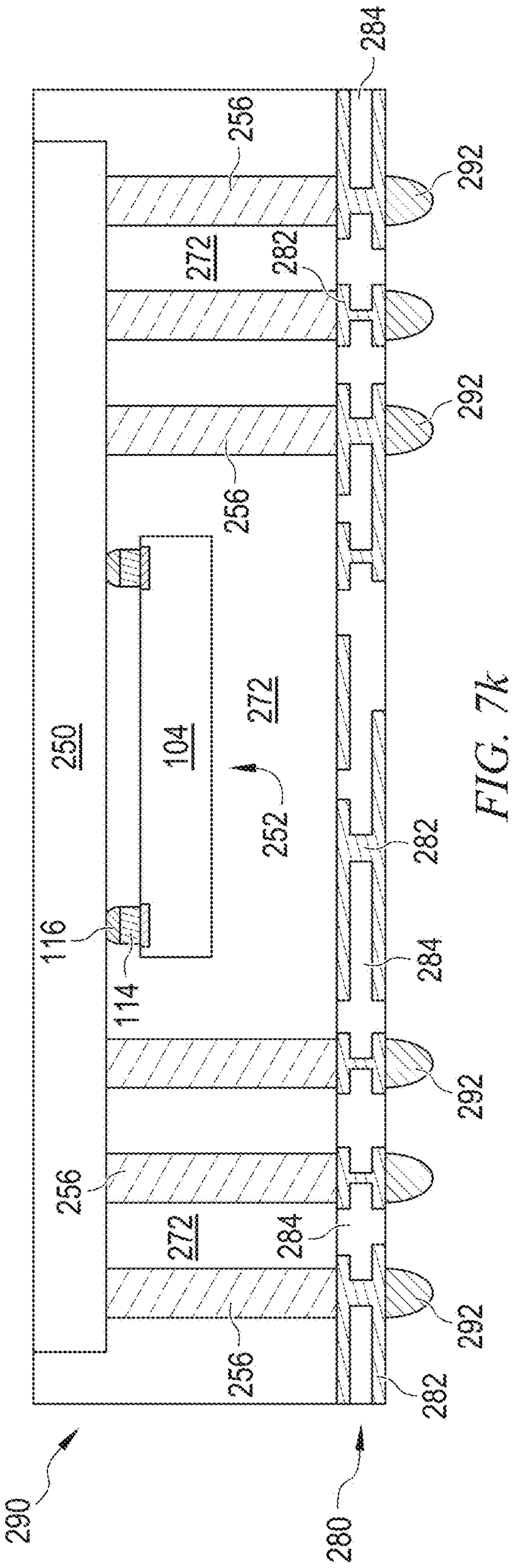

In FIG. 7*j*, reconstituted wafer 270 is singulated using a saw blade or laser cutting tool 288 into individual assemblies 290, each assembly containing a portion of substrate 250, electrical component 252, conductive posts 256 disposed around the electrical component, encapsulant 272, and a portion of interposer 280. The singulation of wafer 270 exposes conductive layer 282 from a side surface of interposer 280. Carrier 268 is removed by chemical mechanical polishing (CMP), mechanical peel-off, mechanical grinding, thermal bake, UV light, or wet stripping, leaving assembly 290, as shown in FIG. 7*k*.

An electrically conductive bump material is deposited over conductive layer 282 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 282 using a suitable attachment or bonding process. In one embodiment, the bump material is reflowed by heating the material above its melting point to form balls or bumps 292. In one embodiment, bump 292 is formed over a UBM having a wetting layer, barrier layer, and adhesive layer. Bump 292 can also be compression bonded or thermocompression bonded to conductive layer 282. Bump 292 represents one type of interconnect structure that can be formed over conductive layer 282. The interconnect structure can also use bond wires, conductive paste, stud bump, micro bump, or other electrical interconnect.

Electrical component 252 may contain IPDs that are susceptible to or generate EMI, RFI, harmonic distortion, and inter-device interference. For example, the IPDs contained within electrical component 252 may provide the electrical characteristics needed for high-frequency applications, such as resonators, high-pass filters, low-pass filters, band-pass filters, symmetric Hi-Q resonant transformers, and tuning capacitors. In another embodiment, electrical component 252 may contain digital circuits switching at a high frequency, which could interfere with the operation of IPDs in C2W package 310 or other IPD in proximity thereto.

Figure 7L:
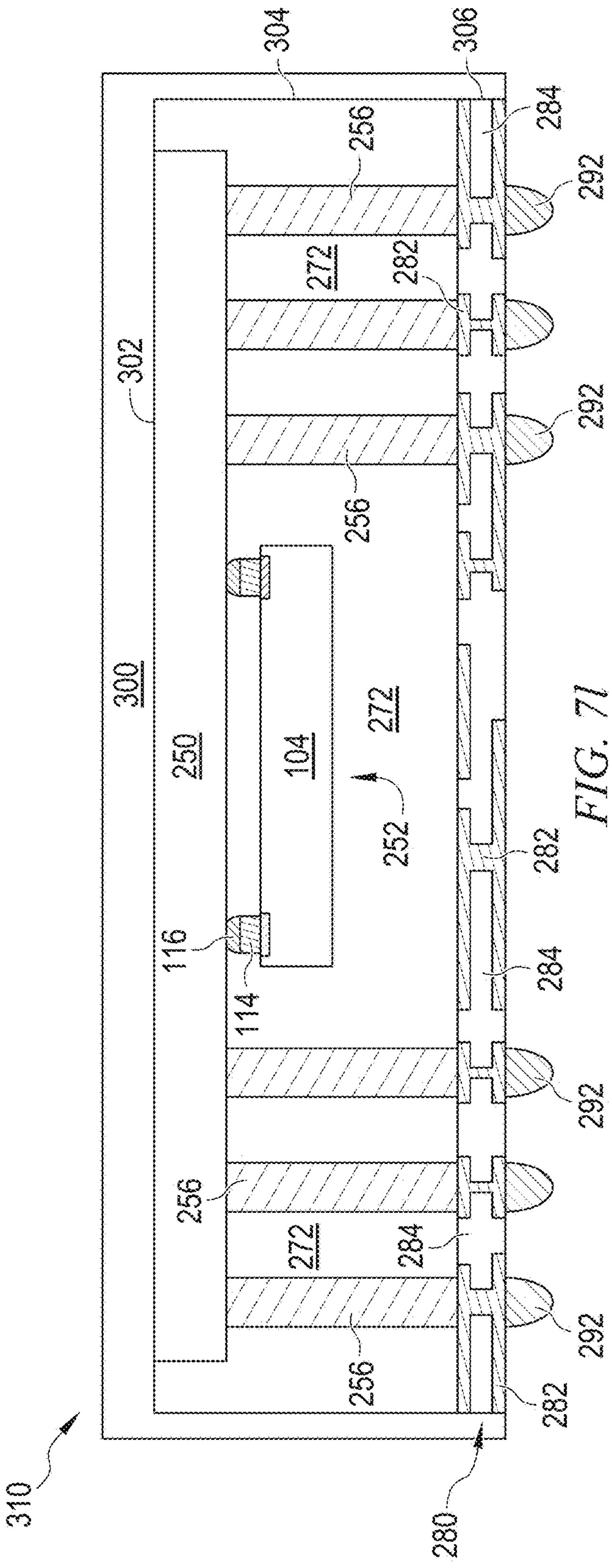

To address EMI, RFI, harmonic distortion, and inter-device interference, shielding material 300 is deposited over surface 302 of substrate 250, as well as surface 304 of encapsulant 272 and surface 306 of interposer 280, as shown in FIG. 7*l*. Electromagnetic shielding material 300 can be one or more layers of Al, Cu, Sn, Ni, Au, Ag, or other suitable conductive material. Alternatively, electromagnetic shielding material 300 can be carbonyl iron, stainless steel, nickel silver, low-carbon steel, silicon-iron steel, foil, conductive resin, carbon-black, and aluminum flake. In yet another embodiment shielding material 300 can be ferromagnetic materials, Ni, Fe, Ni—Fe alloys, amorphous metal alloys, nanocrystalline metal alloys, magnetic sheets, and other metals and composites capable of reducing or inhibiting the effects of EMI, RFI, and other inter-device interference. Shielding material 300 can be formed as multiple layers of conductive and magnetic material. Shielding material 300 is grounded through conductive layer 282, as exposed from surface 306 of interposer 280, and bumps 292 to an external ground. The assembly shown in FIG. 7*l* is referenced as C2W package 310.

C2W packages 310 contains electrical component 252, conductive posts 256, interposer 280, encapsulant 272, and shielding material 300 to reduce or inhibit the effects of EMI, RFI, and other inter-device interference. Shielding material 300 is grounded through conductive layer 282, as exposed from surface 306 of interposer 280 and bumps 292 to an external ground.

Figure 8:
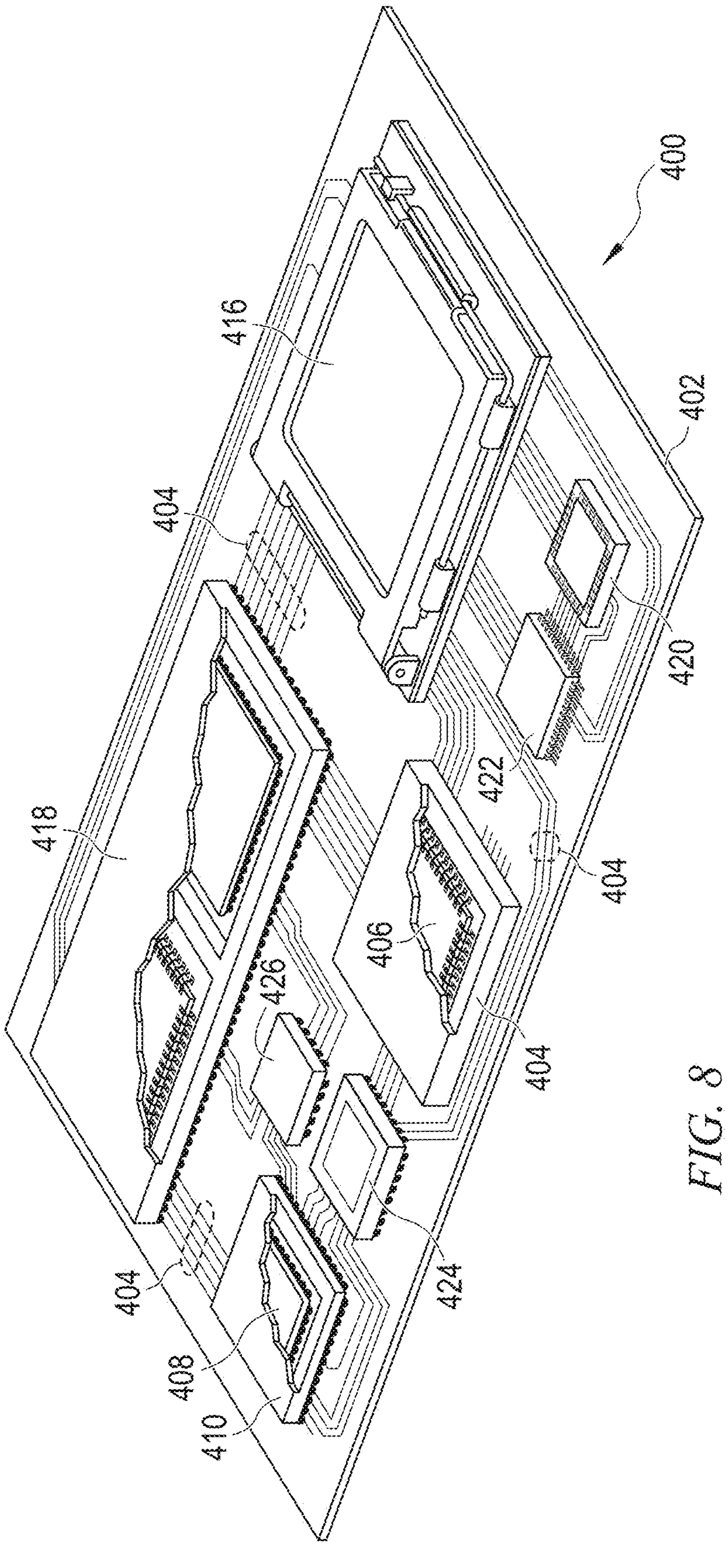
FIG. 8 illustrates a printed circuit board (PCB) with different types of packages disposed on a surface of the PCB.

FIG. 8 illustrates electrical device 400 having a chip carrier substrate or PCB 402 with a plurality of semiconductor packages disposed on a surface of PCB 402, including C2W packages 178, 184, 220, 234, 238, 244, and 310. Electrical device 400 can have one type of semiconductor package, or multiple types of semiconductor packages, depending on the application.

Electrical device 400 can be a stand-alone system that uses the semiconductor packages to perform one or more electrical functions. Alternatively, electrical device 400 can be a subcomponent of a larger system. For example, electrical device 400 can be part of a tablet, cellular phone, digital camera, communication system, or other electrical device. Alternatively, electrical device 400 can be a graphics card, network interface card, or other signal processing card that can be inserted into a computer. The semiconductor package can include microprocessors, memories, ASIC, logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 8, PCB 402 provides a general substrate for structural support and electrical interconnect of the semiconductor packages disposed on the PCB. Conductive signal traces 404 are formed over a surface or within layers of PCB 402 using evaporation, electrolytic plating, electroless plating, screen printing, or other suitable metal deposition process. Signal traces 404 provide for electrical communication between each of the semiconductor packages, mounted components, and other external system components. Traces 404 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may have the first level packaging where the die is mechanically and electrically disposed directly on the PCB. For the purpose of illustration, several types of first level packaging, including bond wire package 406 and flipchip 408, are shown on PCB 402. Additionally, several types of second level packaging, including ball grid array (BGA) 410, bump chip carrier (BCC) 412, land grid array (LGA) 416, multi-chip module (MCM) or SIP module 418, quad flat non-leaded package (QFN) 420, quad flat package 422, embedded wafer level ball grid array (eWLB) 424, and wafer level chip scale package (WLCSP) 426 are shown disposed on PCB 402. In one embodiment, eWLB 424 is a fan-out wafer level package (Fo-WLP) and WLCSP 426 is a fan-in wafer level package (Fi-WLP). Depending upon the system requirements, any combination of semiconductor packages, configured with any combination of first and second level packaging styles, as well as other electrical components, can be connected to PCB 402. In some embodiments, electrical device 400 includes a single attached semiconductor package, while other embodiments call for multiple interconnected packages. By combining one or more semiconductor packages over a single substrate, manufacturers can incorporate pre-made components into electrical devices and systems. Because the semiconductor packages include sophisticated functionality, electrical devices can be manufactured using less expensive components and a streamlined manufacturing process. The resulting devices are less likely to fail and are less expensive to manufacture, resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
a silicon substrate;
an interconnect structure disposed on the silicon substrate;
an electrical component disposed on the interconnect structure;
a conductive post formed on the interconnect structure;
an encapsulant deposited over the silicon substrate, interconnect structure, electrical component, and conductive post; and
a shielding material disposed over the silicon substrate, interconnect structure, and encapsulant and grounded through the conductive post, wherein the shielding material is deposited directly on a back surface of the silicon substrate opposite the electrical component.

2. The semiconductor device of claim 1, wherein the interconnect structure includes an interposer.

3. The semiconductor device of claim 1, wherein the shielding material is grounded through the interconnect structure.

4. The semiconductor device of claim 1, further including a wire embedded in the encapsulant and coupled to the shielding material to ground the shielding material.

5. The semiconductor device of claim 1, further including a conductive via formed through the silicon substrate and coupled to the shielding material to ground the shielding material.

6. The semiconductor device of claim 1, further including an interposer disposed over the encapsulant.

7. A semiconductor device, comprising:
a substrate;
an interposer disposed over the substrate;
an electrical component disposed over the interposer;
a conductive post formed over the interposer;
an encapsulant deposited over the substrate, interposer, electrical component, and conductive post; and a shielding material disposed over the substrate, interposer, electrical component, and conductive post, wherein the shielding material is disposed directly on a back surface of the substrate opposite the electrical component.

8. The semiconductor device of claim 7, wherein the shielding material is grounded through the interposer.

9. The semiconductor device of claim 7, further including a wire embedded in the encapsulant and coupled to the shielding material to ground the shielding material.

10. The semiconductor device of claim 7, further including a conductive via formed through the substrate and coupled to the shielding material to ground the shielding material.

11. The semiconductor device of claim 7, further including an interposer disposed over the encapsulant.

12. The semiconductor device of claim 7, wherein the shielding material is grounded through the conductive post.

13. A method of making a semiconductor device, comprising:
providing a silicon substrate;
disposing an interconnect structure on the silicon substrate;
disposing an electrical component on the interconnect structure;
forming a conductive post on the interconnect structure;
depositing an encapsulant over the silicon substrate, interconnect structure, electrical component, and conductive post; and
disposing a shielding material over the silicon substrate, interconnect structure, and encapsulant and grounded through the conductive post, wherein the shielding material is deposited directly on the silicon substrate.

14. The method of claim 13, wherein the interconnect structure includes an interposer.

15. The method of claim 13, wherein the shielding material is grounded through the interconnect structure.

16. The method of claim 13, further including forming a wire embedded in the encapsulant and coupled to the shielding material to ground the shielding material.

17. The method of claim 13, further including forming a conductive via through the silicon substrate and coupled to the shielding material to ground the shielding material.

18. The method of claim 13, further including disposing an interposer over the encapsulant.

19. A method of making a semiconductor device, comprising:
providing a substrate;
disposing an interposer over the substrate;
disposing an electrical component over the interposer;
forming a conductive post over the interposer;
depositing an encapsulant over the substrate, interposer, electrical component, and conductive post; and
disposing a shielding material over the substrate, interposer, electrical component, and conductive post, wherein the shielding material is disposed directly on a back surface of the substrate opposite the electrical component.

20. The method of claim 19, wherein the shielding material is grounded through the interposer.

21. The method of claim 19, further including forming a wire embedded in the encapsulant and coupled to the shielding material to ground the shielding material.

22. The method of claim 19, further including forming a conductive via through the substrate and coupled to the shielding material to ground the shielding material.

23. The method of claim 19, further including disposing an interposer over the encapsulant.

* * * * *